United States Patent
Kim et al.

(10) Patent No.: US 8,488,381 B2
(45) Date of Patent: Jul. 16, 2013

(54) NON-VOLATILE MEMORY DEVICE HAVING VERTICAL STRUCTURE AND METHOD OF OPERATING THE SAME

(75) Inventors: Doogon Kim, Hwaseong-si (KR); Sunil Shim, Seoul (KR); Hansoo Kim, Suwon-si (KR); Wonseok Cho, Suwon-si (KR); Jaehoon Jang, Seongnam-si (KR); Jaehun Jeong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 292 days.

(21) Appl. No.: 12/860,049

(22) Filed: Aug. 20, 2010

(65) Prior Publication Data

US 2010/0315875 A1 Dec. 16, 2010

Related U.S. Application Data

(63) Continuation-in-part of application No. 12/658,072, filed on Feb. 2, 2010.

(30) Foreign Application Priority Data

Feb. 2, 2009 (KR) .................. 10-2009-0008041
Sep. 3, 2009 (KR) .................. 10-2009-0083148
Jan. 25, 2010 (KR) .................. 10-2010-0006475

(51) Int. Cl.
*G11C 16/04* (2006.01)

(52) U.S. Cl.
USPC ............ 365/185.17; 365/185.11; 365/185.18; 365/185.28

(58) Field of Classification Search
USPC .............. 365/185.11, 185.17, 185.18, 185.28
See application file for complete search history.

(56) References Cited

U.S. PATENT DOCUMENTS

| | | | | |
|---|---|---|---|---|
| 5,940,321 | A * | 8/1999 | Takeuchi et al. | 365/185.17 |
| 6,307,785 | B1 * | 10/2001 | Takeuchi et al. | 365/185.23 |
| 7,696,559 | B2 | 4/2010 | Arai et al. | |
| 7,701,771 | B2 | 4/2010 | Jeong et al. | |
| 8,004,893 | B2 * | 8/2011 | Sim et al. | 365/185.05 |
| 2004/0125629 | A1 * | 7/2004 | Scheuerlein et al. | 365/17 |
| 2006/0050559 | A1 * | 3/2006 | Sakui et al. | 365/185.17 |
| 2007/0070708 | A1 | 3/2007 | Ichige et al. | |

(Continued)

FOREIGN PATENT DOCUMENTS

| | | |
|---|---|---|
| JP | 2007-180389 | 7/2007 |
| JP | 2007-317874 | 12/2007 |

(Continued)

OTHER PUBLICATIONS

"Non-volatile Memory Device Having Vertical Structure and Method of Operating the Same" Specification, Drawings, and Prosecution History, of U.S. Appl. No. 12/658,072, filed Feb. 2, 2010, by Jae-hun Jeong, et al., which is stored in the United States Patent and Trademark Office.

*Primary Examiner* — Hoai V Ho
(74) *Attorney, Agent, or Firm* — Onello & Mello, LLP

(57) ABSTRACT

Provided is a method of operating a non-volatile memory device. The method includes applying a turn-on voltage to each of first and second string select transistors of a first NAND string, applying first and second voltages to third and fourth string select transistors of a second NAND string, respectively, and applying a high voltage to word lines connected with memory cells of the first and second NAND strings.

14 Claims, 31 Drawing Sheets

U.S. PATENT DOCUMENTS

| | | |
|---|---|---|
| 2007/0158736 A1 | 7/2007 | Arai et al. |
| 2008/0031048 A1 | 2/2008 | Jeong et al. |
| 2008/0173932 A1 | 7/2008 | Kidoh et al. |
| 2008/0225594 A1 | 9/2008 | Lee et al. |
| 2009/0091975 A1 | 4/2009 | Lee et al. |
| 2009/0140313 A1 | 6/2009 | Joo |
| 2009/0168533 A1 | 7/2009 | Park et al. |
| 2009/0184360 A1 | 7/2009 | Jin et al. |
| 2009/0238003 A1* | 9/2009 | Namiki et al. ........... 365/185.17 |
| 2010/0159657 A1 | 6/2010 | Arai et al. |
| 2010/0195395 A1 | 8/2010 | Jeong et al. |
| 2010/0322000 A1* | 12/2010 | Shim et al. ............... 365/185.03 |

FOREIGN PATENT DOCUMENTS

| | | |
|---|---|---|
| JP | 2008-171918 | 7/2008 |
| JP | 2009-94479 | 4/2009 |
| KR | 10-0850508 | 7/2008 |
| KR | 10-2009-0035203 | 4/2009 |
| KR | 10-2009-0072406 | 7/2009 |

* cited by examiner

Fig. 15

|  | NS11 | NS12 | NS21 | NS22 |
|---|---|---|---|---|
| BL | BL1 with Vss | BL2 with Vcc | BL1 with Vss | BL2 with Vcc |
| TS1 | On with Vcc | | Off with Vss | |
| TS2 | | | | |
| WL | Vpass and Vpgm | | | |

Fig. 16

|  | Selected Strings | | Unselected Strings | |
|---|---|---|---|---|
|  | NS11 | NS12 | NS21 | NS22 |
| BL | BL1 with Vss | BL2 with Vcc | BL1 with Vss | BL2 with Vcc |
| TS1 | On with Vcc | | Off with V3 | |
| TS2 | | | Off with V4 | |
| WL | Vpass and Vpgm | | | |

NON-VOLATILE MEMORY DEVICE HAVING VERTICAL STRUCTURE AND METHOD OF OPERATING THE SAME

CROSS-REFERENCE TO RELATED APPLICATIONS

This U.S. non-provisional patent application is a continuation-in-part of U.S. patent application Ser. No. 12/658,072 filed Feb. 2, 2010, which claims priority under 35 U.S.C. §119 of Korean Patent Application No. 10-2009-0008041, filed Feb. 2, 2009, and Korean Patent Application No. 10-2009-0083148, filed on Sep. 3, 2009. This continuation-in-part also claims priority under 35 U.S.C. §119 of Korean Patent Application No. 10-2010-0006475, filed on Jan. 25, 2010, the entire contents of which applications are hereby incorporated by reference.

BACKGROUND

The inventive concept relates to a semiconductor device, and more particularly, to a non-volatile memory device having a vertical structure and method of operating the same.

Although electronic devices have become continually reduced in size, they are nevertheless required to process a large amount of data. Thus, in order to reduce size while maintaining or improving upon processing capabilities, non-volatile memory devices for use in such electronic devices need to be reduced in size while increasing the integration degree thereof. To this end, non-volatile memory devices having a vertical structure have been considered instead of those having a conventional flat structure. However, non-volatile memory devices having a vertical structure are complicated to manufacture and, thus, the reliability thereof tends to be lower than more conventional memory devices having a flat structure.

SUMMARY

In accordance with the present disclosure, provided is a non-volatile memory device having a vertical structure and a method of operating the same that can enhance the reliability of the memory device.

In accordance with one aspect of the inventive concept, a method of operating a non-volatile memory device is provided. The method includes: applying a turn-on voltage to each of first and second string select transistors of a first NAND string; applying first and second voltages to third and fourth string select transistors of a second NAND string, respectively; and applying a high voltage to word lines connected with memory cells of the first and second NAND strings.

The second voltage may have a level higher than the first voltage.

The first voltage may have a level lower than a ground voltage.

The second voltage may have a level lower than a threshold voltage of the fourth string select transistor.

The third string select transistor may be connected between the fourth string select transistor and a bit line corresponding to the second NAND string.

The method of operating the non-volatile memory device may further comprise: applying a second high voltage into dummy cells between the first to fourth string select transistors and the memory cells, wherein the second high voltage has a level lower than the high voltage.

In accordance with another aspect of the inventive concept, a non-volatile memory device is provided. The non-volatile memory device includes: a memory cell array; and a peripheral circuit configured to access the memory cell array. The memory cell array includes: a substrate; a plurality of memory cell groups arranged in rows and columns on the substrate. Each memory cell group includes a plurality of memory cells stacked along a direction crossing the substrate; a plurality of first select transistor groups are provided between the substrate and the plurality of memory cell groups respectively; and a plurality of second select transistor groups are provided on the plurality of memory cell groups respectively. The peripheral circuit may be configured to drive second select transistors of a second select transistor group corresponding to an unselected memory cell group of the plurality of memory cell groups independently during a program operation.

The peripheral circuit may be further configured to drive the second select transistors of the second select transistor group with different voltages during a program operation.

A specific second select transistor of the second select transistor group may be driven with a first voltage, and another second select transistor of the second select transistor group provided between the specific second select transistor and the unselected memory cell group may be driven with a second voltage higher than the first voltage during a program operation.

The first voltage may have a level higher than a ground voltage.

The second voltage may have a level to turn on the another second select transistor.

The second voltage may have a level to turn off the another second select transistor.

Second select transistors of each second select transistor group may be connected to the peripheral circuit through different metal layers respectively.

First select transistors of each first select transistor group may be driven commonly.

First select transistors of each first select transistor group may be connected commonly on a metal layer.

Memory cells having identical sequence from the substrate are driven commonly.

Memory cells having identical sequence from the substrate may be connected commonly on a metal layer.

In accordance with still another aspect of the inventive concept, a memory system is provided. The memory system includes: a non-volatile memory device; and a controller configured to control the non-volatile memory device. The non-volatile memory device includes a memory cell array and a peripheral circuit configured to access the memory cell array. The memory cell array includes a plurality of memory cell strings having 3 dimensional structure. Each memory cell string includes at least two first select transistors provided on a side and at least two second select transistors provided on another side. The peripheral circuit may be configured to drive the at least two second select transistors of a unselected memory cell string of the plurality of memory cell strings with different voltages during a program operation A specific second select transistor of the at least two second select transistors of the unselected memory cell string is driven with a first voltage, and another second select transistor of the at least two second select transistors of the unselected memory cell string provided between the specific second select transistor and memory cells is driven with a second voltage having a level higher than the first voltage during a program operation.

The non-volatile memory device and the controller forms a solid state drive SSD.

BRIEF DESCRIPTION OF THE DRAWINGS

Exemplary embodiments of the inventive concept will be more clearly understood from the following detailed description taken in conjunction with the accompanying drawings, in which:

FIG. 15 shows a voltage bias condition when a program operation is performed in the memory device of FIG. 14;

FIG. 16 is a table showing resulting from an embodiment of a method of controlling a voltage according to aspects of the inventive concept;

DETAILED DESCRIPTION OF THE EMBODIMENTS

Figure 1A:
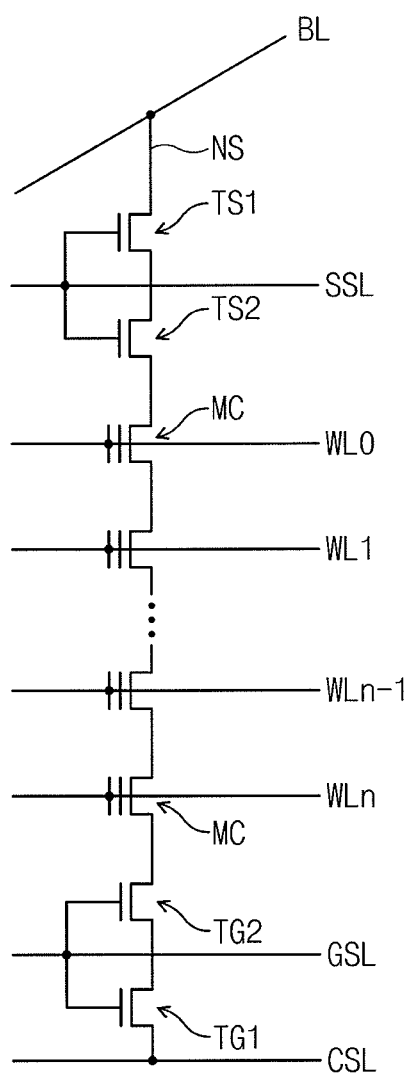
FIG. 1A is a first embodiment of a circuit diagram of a non-volatile memory device, according to aspects of the inventive concept.

Hereinafter, exemplary embodiments of the inventive concept will be described more fully with reference to the accompanying drawings. The inventive concept may, however, be embodied in many different forms and should not be construed as being limited to the embodiments set forth herein. Rather, these embodiments are provided so that this disclosure will convey the inventive concept to those of ordinary skill in the art. In the drawings, the size of each element may be exaggerated for clarity.

The terms used in the following embodiments may be understood as being generally known in the technical field to which the inventive concept pertains. For example, the term, 'at least one' includes one or more of the associated listed items and is intended to include not only a singular form but also plural forms.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

FIG. 1A is an embodiment of a circuit diagram of a non-volatile memory device according to aspects of the inventive concept. Referring to FIG. 1, a NAND string NS may extend in a vertical direction, that is, it may have a vertical structure relative to a substrate (not shown). The NAND string NS may have at least one pair of string selection transistors TS1 and TS2, a plurality of memory cells MC, and at least one pair of ground selection transistors TG1 and TG2. A bit line BL may be connected to one end of the NAND string NS and a common source line CSL may be connected to the other end of the NAND string NS.

The memory cells MC may be arranged in series in the vertical direction. The memory cells MC may store data. A plurality of word lines WL0, WL1, through WLn−1, and WLn, where "n"+1 is the number of word lines, may be respectively coupled to the memory cells MC in order to control the memory cells MC. The total number of the memory cells MC may be appropriately determined according to the capacity of the non-volatile memory device.

The string selection transistors TS1 and TS2 may be arranged near one end of the memory cells MC. For example, the string selection transistors TS1 and TS2 may be located between the bit line BL and the memory cells MC, and may be connected in series to the memory cells MC. The string selection transistors TS1 and TS2 may control an exchange of signals between the bit line BL and the memory cells MC. The string selection line SSL may be commonly coupled to the string selection transistors TS1 and TS2. Thus, the string selection transistors TS1 and TS2 may operate together as if they were unified as one transistor.

The ground selection transistors TG1 and TG2 may be located opposite to the string selection transistors TS1 and TS2, and closer to the other end of the memory cells MC. For example, ground selection transistors TG1, TG2 may be located between the common source line CSL and the memory cells MC, and may be connected in series to the memory cells MC. The ground selection transistors TG1 and TG2 may exchange signals between the common source line CSL and the memory cells MC. The ground selection line GSL may be commonly coupled to the ground selection transistors TG1 and TG2. Thus, the ground selection transistors TG1 and TG2 may operate together as if they were unified as one transistor.

For example, in order to perform a programming operation, 0V may be applied to the bit line BL, an 'ON' voltage (a turn-on voltage) may be applied to the string selection line SSL, and an 'OFF' voltage (turn-off voltage) may be applied to the ground selection line GSL. The 'ON' voltage may be equal to or greater than a threshold voltage of the memory cells MC in order to turn on the string selection transistors TS1 and TS2, and the 'OFF' voltage may be less than the threshold voltage in order to turn off the ground selection transistors TG1 and TG2. A program voltage may be applied to a memory cell MC selected from among the memory cells MC, and a pass voltage may be applied to the other memory cells MC. When the program voltage is applied to the selected memory cell MC, electric charges may be injected into the selected memory cell MC due to Fowler-Nordheim (FN) tunneling. FN tunneling is known in the art, so not discuss in detail herein. The pass voltage may be greater than the threshold voltage.

In order to perform a read operation, a read voltage may be applied to the bit line BL, and the 'ON' voltage may be applied to the string selection line SSL and the ground selection line GSL. A reference voltage may be applied to a memory cell MC selected from among the memory cells MC, and the pass voltage may be applied to the other memory cells.

In order to perform an erase operation, an erase voltage may be applied to the bodies of the memory cells MC, and 0V may be applied to the word lines WL0, WL1 through WLn−1, and WLn. Thus, data may be erased from the memory cells MC at the same time.

Alternatively, one of either the string selection transistors TS1 and TS2 or the ground selection transistors TG1 and TG2 may be omitted. The string selection transistors TS1 and TS2 and the ground selection transistors TG1 and TG2 may be respectively referred to as first selection transistors and second selection transistors and vice versa.

Figure 1B:
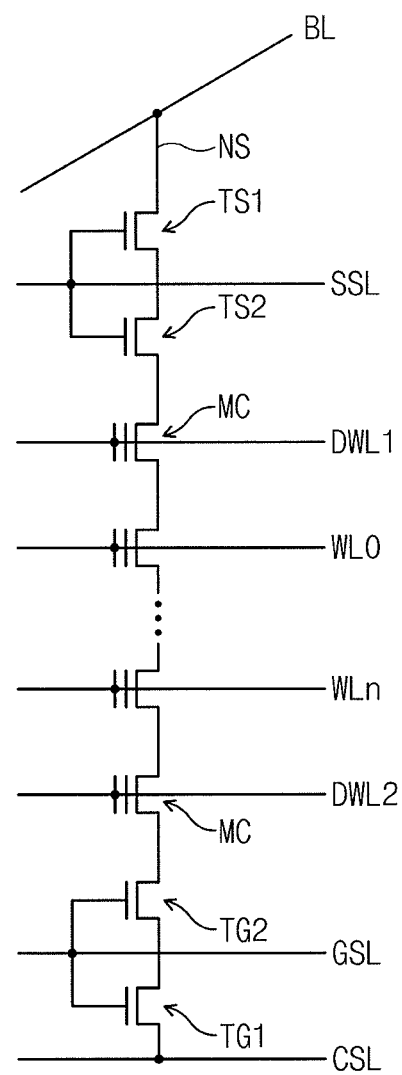
FIG. 1B is a circuit diagram of an embodiment of a variation of the non-volatile memory device of FIG. 1A.

FIG. 1B is a circuit diagram of an applied embodiment of the non-volatile memory device of FIG. 1A. In comparison with the non-volatile memory device of FIG. 1A, a non-volatile memory device of FIG. 1B further includes a first dummy word line DWL1 between a string select line SSL and word lines WL0 to WLn and a second dummy word line DWL2 between a ground select line GSL and the word lines WL0 to WLn.

In an embodiment, each dummy word line is connected to a dummy memory cell. For example, the dummy memory cell may be configured similar to a normal memory cell MC.

Figure 2:
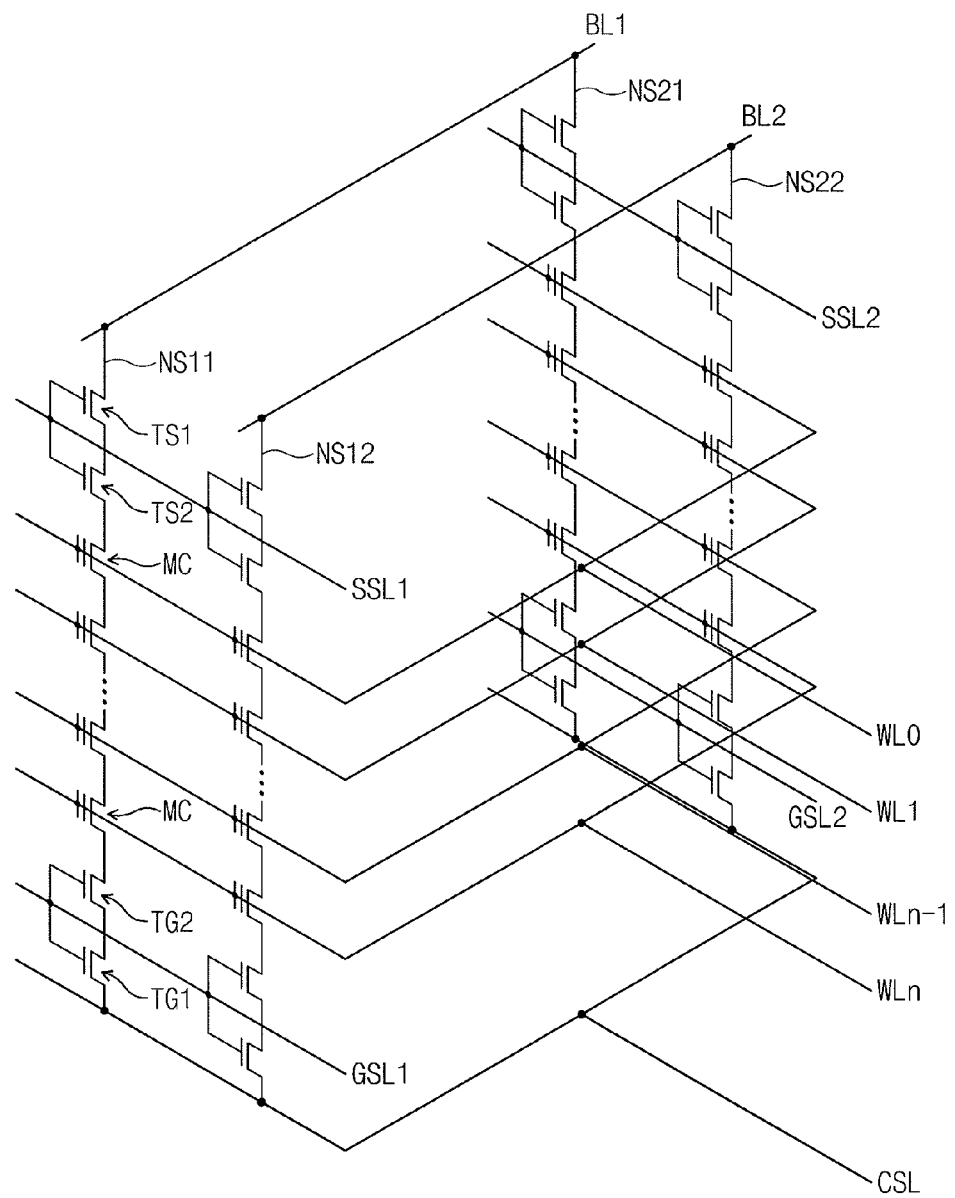
FIG. 2 is a second embodiment of a circuit diagram of a non-volatile memory device, according to aspects of the inventive concept.

FIG. 2 is another embodiment of a circuit diagram of a non-volatile memory device according to aspects of the inventive concept. The non-volatile memory device of FIG. 2 may correspond to an array of a plurality of non-volatile memory devices, such as that shown in FIG. 1A. Thus, a description of the operations or characteristics of elements that are the same as those of FIG. 1A will not be provided here.

Referring to FIG. 2, a plurality of NAND strings NS11, NS12, NS21, and NS22, each having a vertical structure, may be arranged in a matrix. A first bit line BL1 may be commonly connected to the NAND strings NS11 and NS21 in a first row, and a second bit line BL2 may be commonly connected to the NAND strings NS12 and NS22 in a second row. A common source line CSL may be commonly connected to be opposite to the first and second bit lines BL1 and BL2 and may be commonly connected to the other ends of the NAND strings NS11, NS12, NS21, and NS22. The total number of the NAND strings NS11, NS12, NS21, and NS22 and the total number of the bit lines BL1 and BL2 are just examples thereof, and the inventive concept is not limited thereto.

Word lines WL0, WL1 through WLn−1, and WLn may be commonly connected to memory cells MC arranged at the same level. A first string selection line SSL1 may be commonly coupled to string selection transistors TS1 and TS2 of the NAND strings NS11 and NS12 in the first row. A second string selection line SSL2 may be commonly coupled to string selection transistors TS1 and TS2 of the NAND strings NS21 and NS22 in the second row. A first ground selection line GSL1 may be commonly coupled to ground selection transistors TG1 and TG2 of the NAND strings NS11 and NS12 in the first row. A second ground selection line GSL2 may be commonly coupled to ground selection transistors TG1, and TG2 of the NAND strings NS21 and NS22 in the second row.

In order to perform a program operation, 0V may be applied to a bit line selected from the bit lines BL1 and BL2, and an 'ON' voltage may be applied to the other bit line BL1 or BL2 for channel boosting. Also, the 'ON' voltage may be applied to a string selection line selected from the string selection lines SSL1 and SSL2 and an 'OFF' voltage may be applied to the other string selection line SSL1 or SSL2. Thus, it is possible to selectively operate a NAND string that is commonly connected to the selected bit line and string selection line from among the NAND strings NS11, NS12, NS21, and NS22.

In order to perform a read operation, a read voltage may be applied to a bit line selected from the bit lines BL1 and BL2 and the other bit line BL1 or BL2 may be floated. Also, the 'ON' voltage may be applied to a string selection line selected from string selection lines SSL1 and SSL2 and the 'OFF' voltage may be applied to the other string selection line SSL1 or SSL2. Thus, it is possible to selectively operate a NAND string that is commonly connected to the selected bit line and string selection line from among NAND strings NS11, NS12, NS21, and NS22.

In order to perform an erase operation, an erase voltage may be applied to the bodies of the memory cells MC and 0V may be applied to the word lines WL0, WL1 through WLn−1, and WLn. Accordingly, data may be erased from the memory cells MC of the NAND strings NS11, NS12, NS21, and NS22 at the same time.

Figure 3:
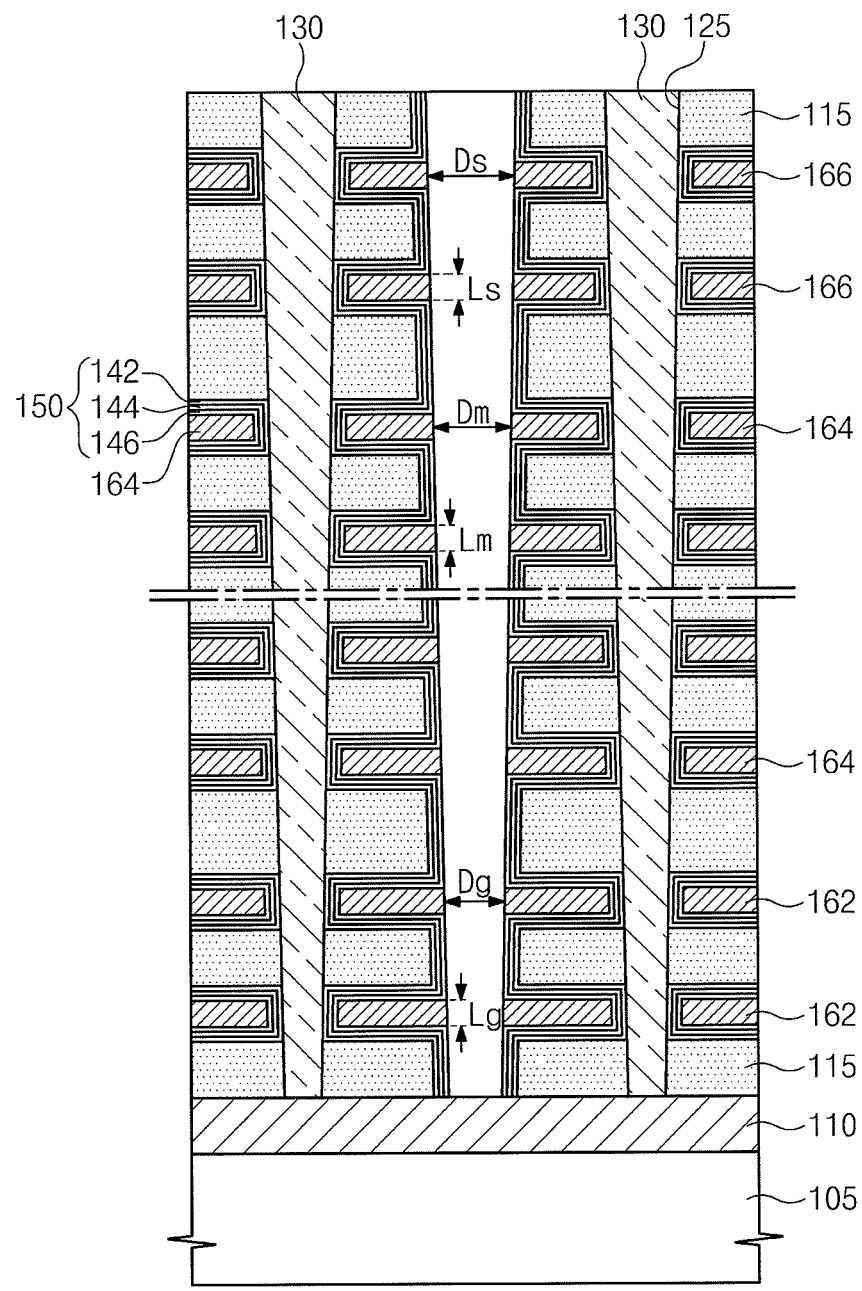
FIG. 3 is a schematic cross-sectional view of the non-volatile memory device of FIG. 2, taken from a direction of word lines.
Figure 4:
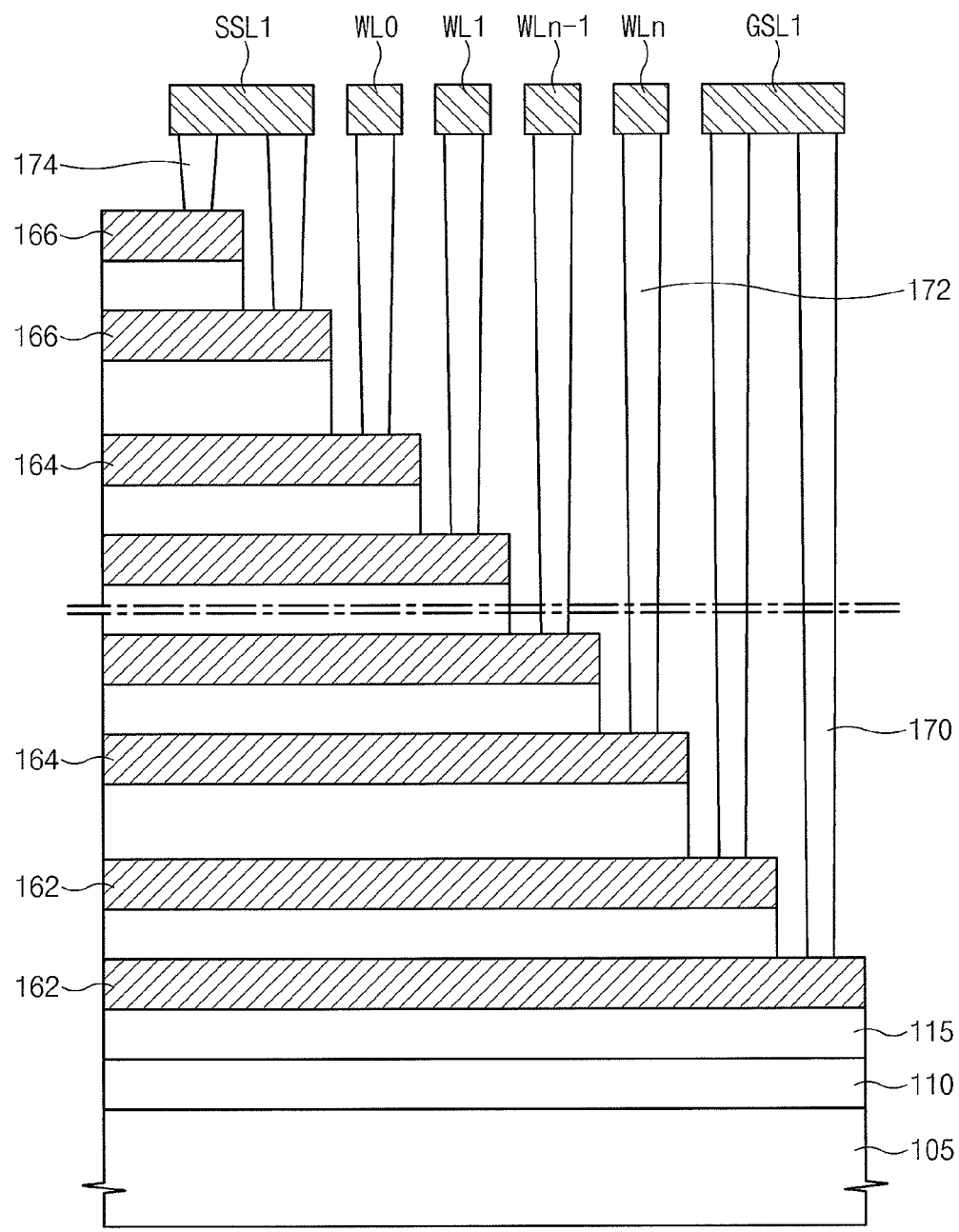
FIG. 4 is a schematic cross-sectional view of the non-volatile memory device of FIG. 2, taken from a direction of bit lines.

FIG. 3 is a schematic cross-sectional view of the non-volatile memory device of FIG. 2, taken from a direction of word lines. FIG. 4 is a schematic cross-sectional view of the non-volatile memory device of FIG. 2, taken from a direction of bit lines.

Referring to FIGS. 2 to 4, a substrate 105 may be provided and prepared. The substrate 105 may be formed of a semiconductor material, e.g., a IV semiconductor, a III-V compound semiconductor, or a II-VI oxide semiconductor. For example, the IV semiconductor may include silicon, germanium, or silicon-germanium. In various embodiments, the substrate 105 may be a bulk wafer or an epitaxial layer.

A plurality of semiconductor poles 130 may be formed to extend upwardly from the substrate 105, here semiconductor poles 130 extend vertically from the substrate 105. The NAND strings NS11, NS12, NS21, and NS22 may be formed along and on the sidewalls of the semiconductor poles 130. The substrate 105 may include an impurity-doped region 110 below the semiconductor poles 130. The impurity-doped region 110 may be a source region and may form a PN junction together with another region of the substrate 105. The common source line CSL of FIG. 2 may be connected to the impurity-doped region 110.

Alternatively, a plurality of source regions may be formed only at the bottoms of the semiconductor poles 130, and the impurity-doped region 110 may function as the common source line CSL. A plurality of drain regions may be formed only at the tops of the semiconductor poles 130 and may be connected to the bit line BL1 of FIG. 2.

The memory cells MC may include a plurality of storage media 150 on the sidewalls of the semiconductor poles 130, and a plurality of control gate electrodes 164 on the storage media 150. Each of the storage media 150 may include a tunneling insulating layer 142 at least partially formed on a sidewall of one of the semiconductor poles 130, a charge storing layer 144 formed on the tunneling insulating layer 142, and a blocking insulating layer 146 formed on the charge storing layer 144, and around the control gate electrode.

A PN junction source/drain region doped with impurities is not formed around the surfaces of the semiconductor poles 130 between the control gate electrodes 164. Thus, the semiconductor poles 130 in the memory cells MC may be continuously doped with impurities of the same conductive type in order to form a well or a channel. In this case, the semiconductor poles 130 between the memory cells MC may be electrically connected using a field effect source/drain region during a program/read operation. The surfaces of the semiconductor poles 130 between the memory cells MC may be turned on using an electric field, i.e., a fringing field, which is formed in the lateral direction of the control gate electrodes 164.

The charge storing layers 144 may have charge storing capabilities. The charge storing layers 144 may be charge trapping layers, and may include, for example, a silicon nitride layer, quantum dots, or nanocrystals. The quantum dots or nanocrystals may be formed of a conductive material, e.g., fine metal or semiconductor particles. Each of the tunneling insulating layers 142 and the blocking insulating layers 146 may include an oxide layer, a nitride layer, or a high-K layer. The high-K layer may be a dielectric layer, the dielectric constant of which is greater than those of an oxide layer and a nitride layer.

The string selection transistors TS1 and TS2 may include a plurality of string selection gate electrodes 166 on the sidewalls of the semiconductor poles 130. The ground selection transistors TG1 and TG2 may include a plurality of ground selection gate electrodes 162 on the sidewalls of the semiconductor poles 130. The string selection gate electrodes 166 and the ground selection gate electrodes 162 may be respectively referred to as first selection gate electrodes and second selection gate electrodes and vice versa.

A PN junction source/drain region doped with impurities is not formed around the surfaces of the semiconductor poles 130 between the memory cells MC, and also is not formed among the string selection transistors TS1 and TS2, the memory cells MC, and the ground selection transistors TG1 and TG2. Instead, the semiconductor poles 130 between the memory cells MC may be electrically connected using the field effect source/drain region during a program/read operation, as described above.

The storage media 150 between the string selection transistors TS1 and TS2 and the semiconductor poles 130 and between the ground selection transistors TG1 and TG2 and the semiconductor poles 130 may function as gate insulating layers and may be thus replaced with one insulating layer in some embodiments. A plurality of interlevel dielectric layers 115 may be formed among the ground selection gate electrodes 162, the control gate electrodes 164, and the string selection gate electrodes 166. The storage media 150 may extend along the surfaces of the interlevel dielectric layers 115.

The string selection gate electrodes 166 may be commonly connected to the first string selection line SSL1 via contact plugs 174. The control gate electrodes 164 may be respectively connected to the word lines WL0, WL1, through WLn−1, and WLn via contact plugs 172. The ground selection gate electrodes 162 may be connected to the first ground selection line GSL1 via contact plugs 170.

In the present embodiment, at least two string selection transistors, i.e., the string selection transistors TS1 and TS2, are used. Thus, since the gate lengths of the string selection gate electrodes 166 may be still less than when only one string selection transistor is used, a gap between the interlevel dielectric layers 115 may be filled with the string selection gate electrode 166 without causing a void. Furthermore, at least two ground selection transistors, i.e., the ground selection transistors TG1 and TG2, are used. Thus, since the gate lengths of the ground selection gate electrodes 162 may still be less than when only one ground selection transistor is used, a gap between the interlevel dielectric layers 115 may be filled with the ground selection gate electrode 164 without causing a void.

The gate length Ls of the string selection gate electrodes 166 may be less than or equal to the distance Ds between the string selection gate electrodes 166 that face each other between adjacent semiconductor poles 130. The gate length Lm of the control gate electrodes 164 may be less than or equal to the distance Dm between the control gate electrodes 164 that face each other between adjacent semiconductor poles 130. The gate length Lg of the ground selection gate electrodes 162 may be less than or equal to the distance Dg between the ground selection gate electrodes 162 that face each other between adjacent semiconductor poles 130. The difference between the gate length Ls of the string selection gate electrodes 166, the gate length Lm of the control gate electrodes 164, and the gate length Lg of the ground selection gate electrodes 162 may be in a range of about 0 nm to 10 nm.

Accordingly, the gaps between the interlevel dielectric layers 115 in a NAND string (NS) may be filled with the string selection gate electrodes 166, the control gate electrodes 164, and/or the ground selection gate electrodes 162 without causing a void, thereby increasing the control reliability of the string selection gate electrodes 166, the control gate electrodes 164, and/or the ground selection gate electrodes 162.

Figure 5:
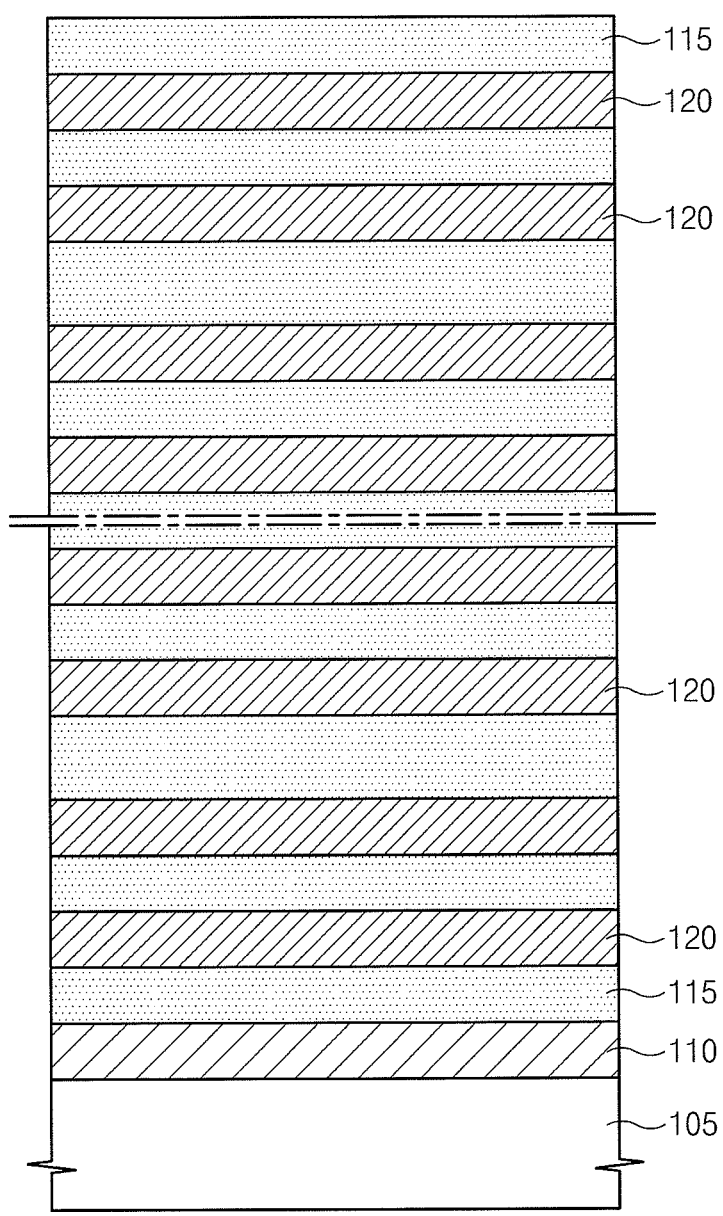
FIG. 5 is a graph showing a result of an experiment in which a saturated current flowing through selection transistors was measured according to the distance between the selection transistors, according to an embodiment of the inventive concept.

FIG. 5 is a graph showing the result of an experiment in which a saturated current flowing through selection transistors was measured according to the distance between the selection transistors, according to aspects of the inventive concept. The experiment of FIG. 5 shows that the greater the distance between the selection transistors, the less the saturated current flowing through the selection transistors. However, the saturated current was not greatly changed. When the distance between the selection transistors was 0 nm, it means that the selection transistors were formed in a single body. When the distance between the selection transistors was about 130 nm, the saturated current was reduced by about less than 10% than the saturated current from when the distance between the selection transistors was 0 nm. The reason why the saturated current was not greatly changed even when the selection transistors were separated from each other is that no PN junction source/drain region is present between the string selection transistors. However, when the distance between the string selection transistors increases, the intensity of a fringing field may be weakened, thus gradually reducing the saturated current.

Figure 6:
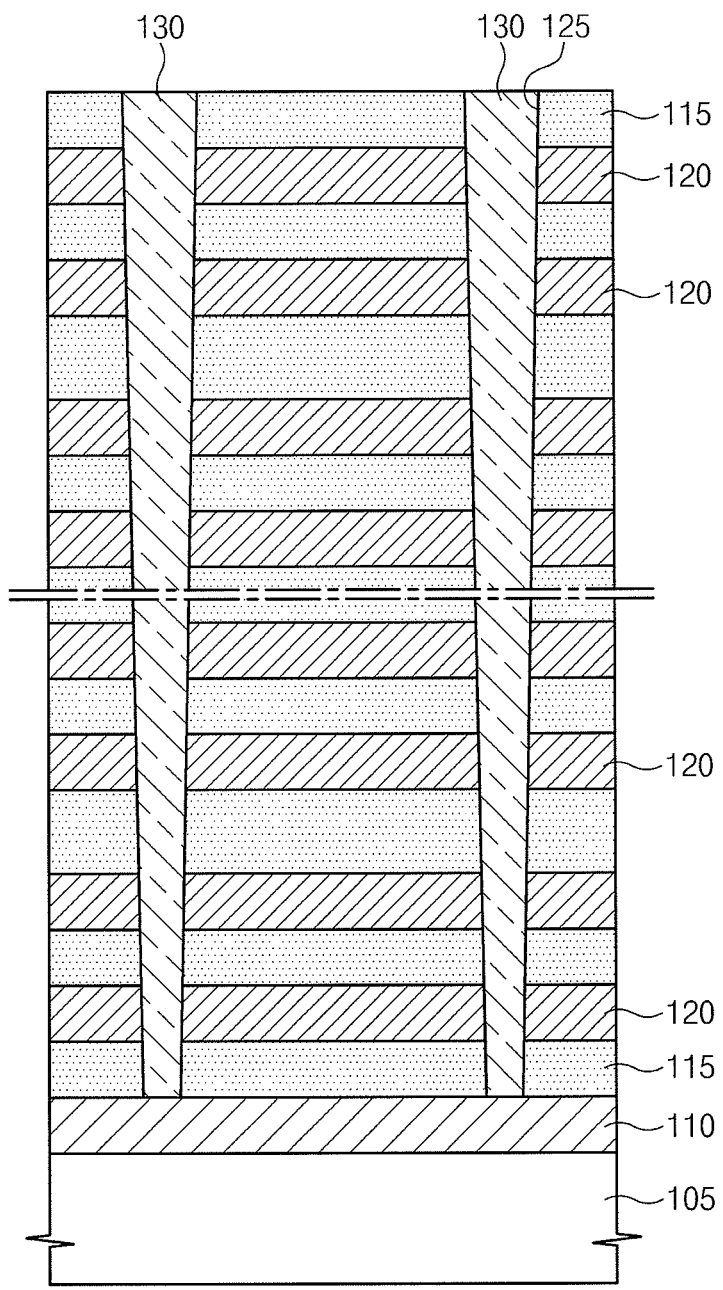
FIGS. 6 through 12 are schematic cross-sectional views illustrating an embodiment of a method of fabricating a non-volatile memory device, according to aspects of the inventive concept.

FIGS. 6 through 12 are schematic cross-sectional views illustrating an embodiment of a method of fabricating a non-volatile memory device according to aspects of the inventive concept. Referring to FIG. 6, an impurity-doped region 110 may be defined by implanting impurities into an upper part of a substrate 105. Next, interlevel dielectric layers 115 and sacrificial layers 120 may be alternately formed on the substrate 105. The sacrificial layers 120 may be etched selectivity with respect to the interlevel dielectric layers 115. For example, interlevel dielectric layers 115 may be oxide layers and the sacrificial layers 120 may be nitride layers.

Figure 7:
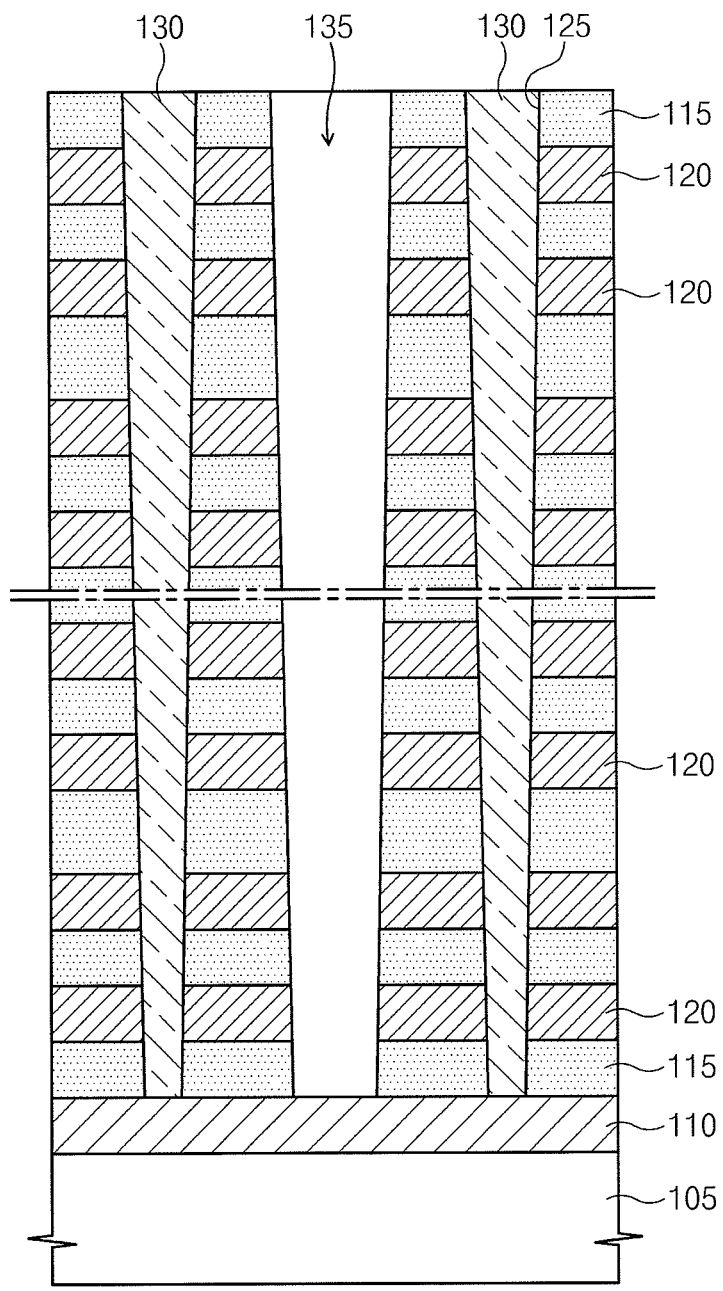

Referring to FIG. 7, a plurality of first holes 125 may be formed by etching the interlevel dielectric layers 115 and the sacrificial layers 120. The first holes 125 may be formed using photolithography and etching processes, as examples. Next, a plurality of semiconductor poles 130 may be formed to fill in the holes 125. For example, the semiconductor poles 130 may be epitaxial layers having a polycrystalline or monocrystalline structure.

Figure 8:
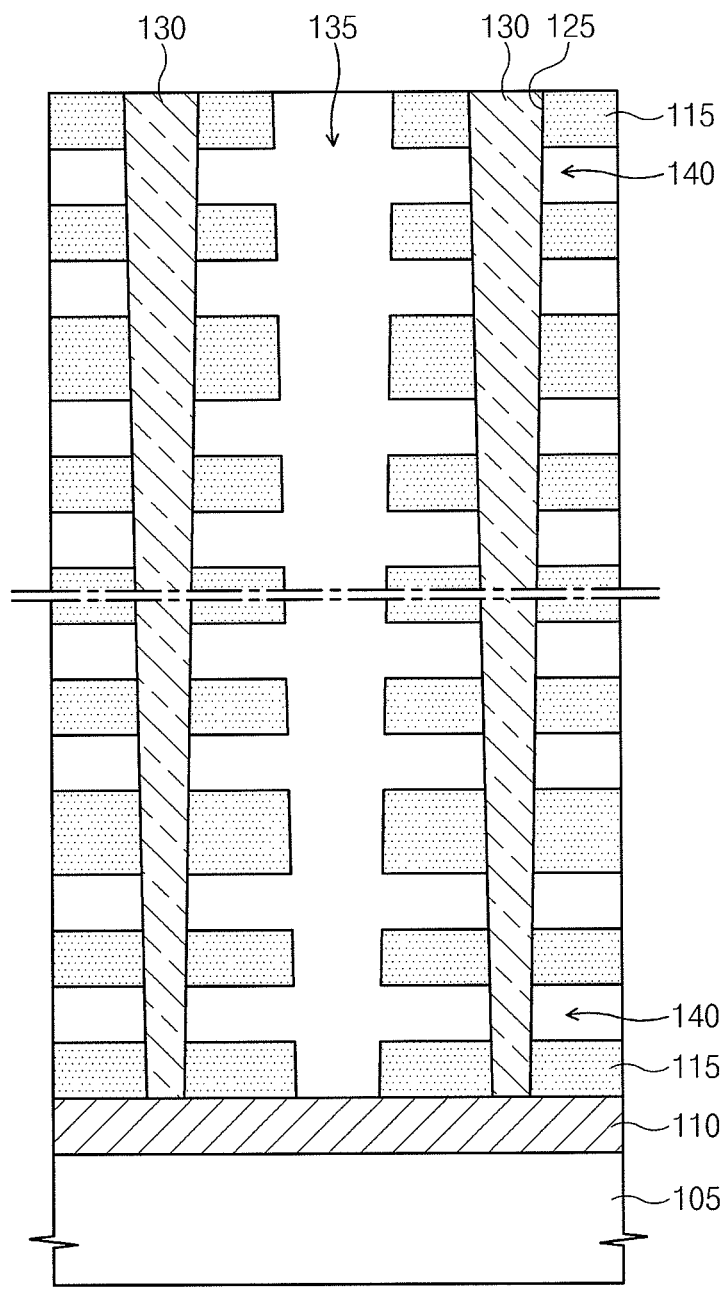

Referring to FIG. 8, a plurality of second holes 135 may be formed by etching the interlevel dielectric layers 115 and the sacrificial layers 120 between the semiconductor poles 130. The second holes 135 may be obtained using the photolithography and etching processes. Within the partial view of FIG. 8, only one second hole 135 is shown.

Figure 9:
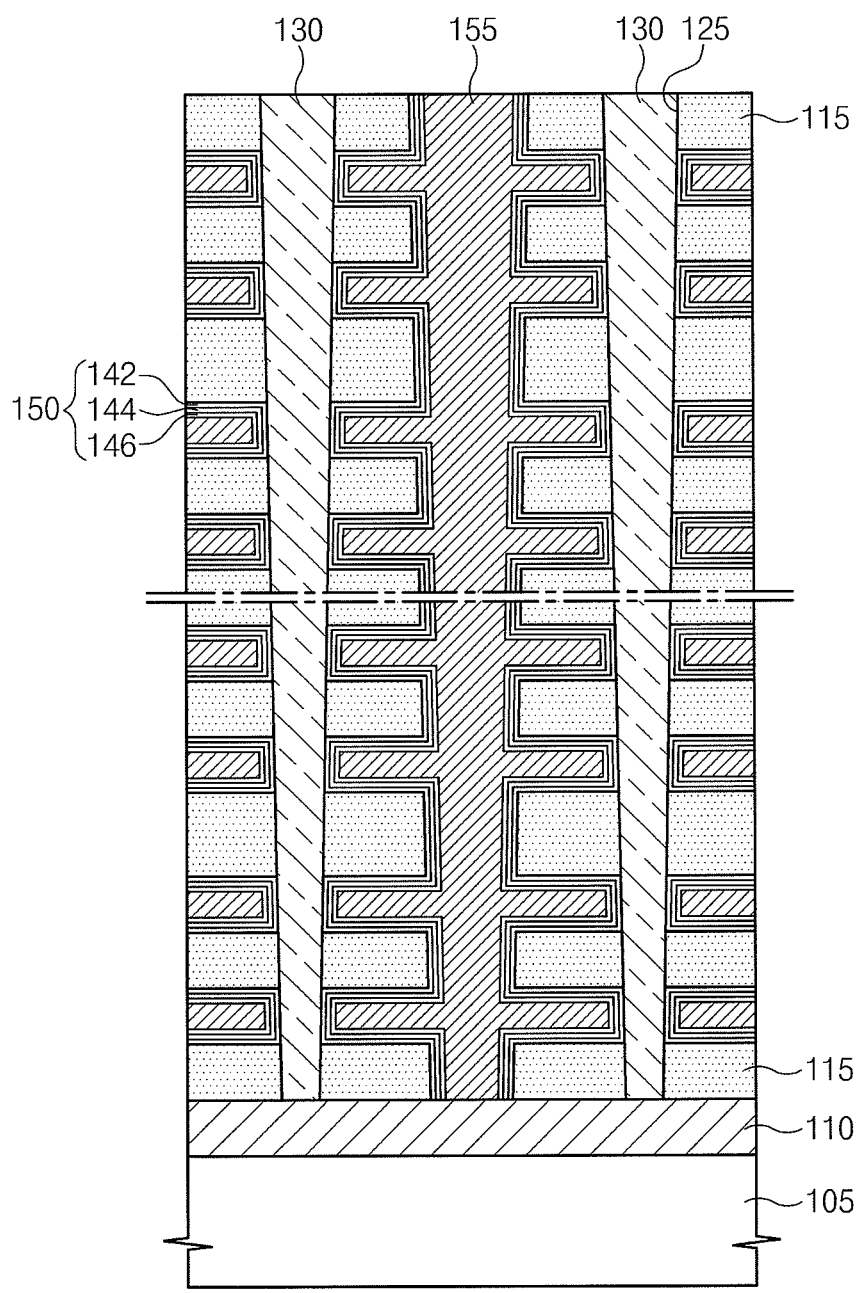

Referring to FIG. 9, the sacrificial layers 120 may be removed. For example, the sacrificial layers 120 may be removed by permeating an etchant between the interlevel dielectric layers 115 via the second holes 135 using isotropic etching. For example, isotropic etching may include wet etching or chemical dry etching, as examples. Thus, the sacrificial layers 120 between the interlevel dielectric layers 115 may be removed to form a plurality of tunnels 140 connected to the second holes 135. The tunnels 140 may expose portions of the sidewalls of the semiconductor poles 130.

Figure 10:
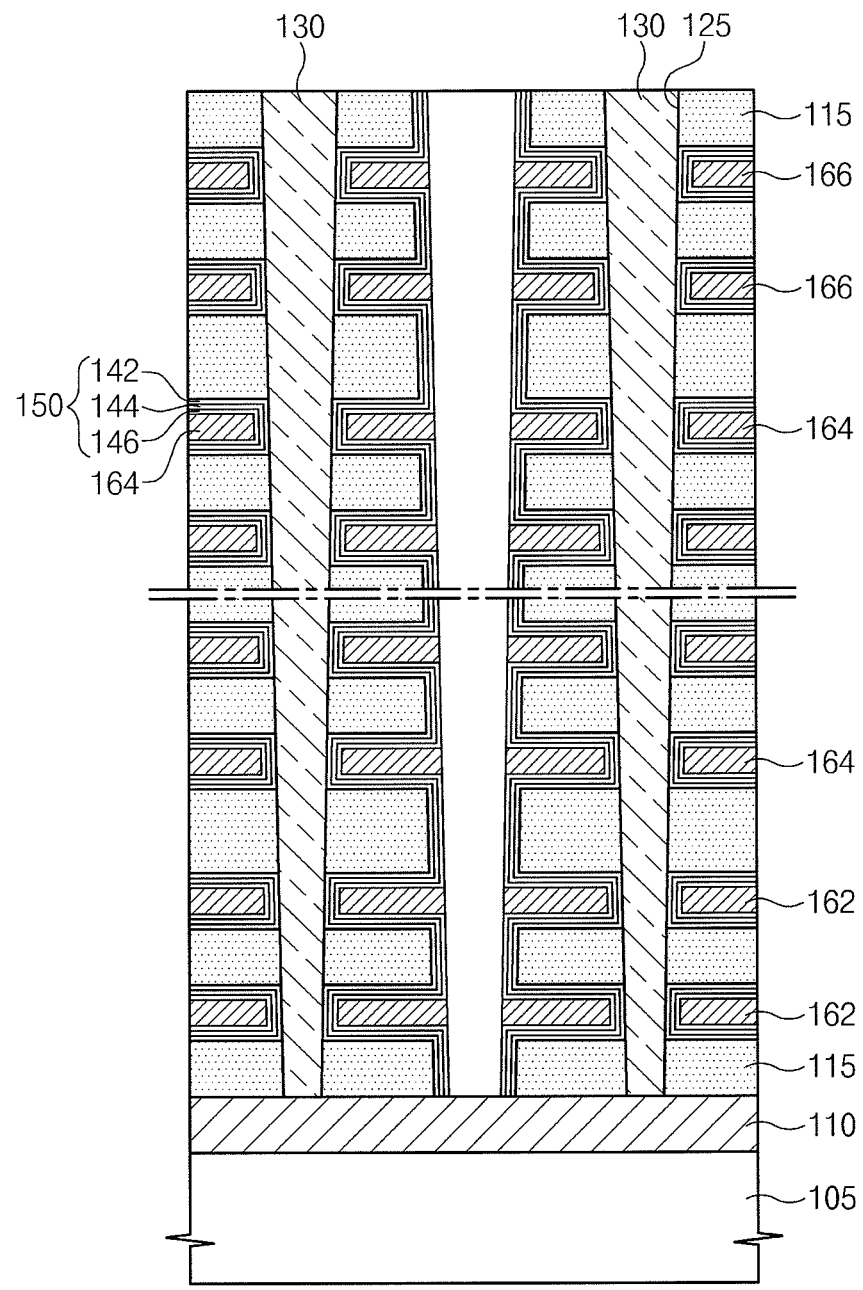

Referring to FIG. 10, a plurality of storage media 150 may be formed on the sidewalls of the interlevel dielectric layers 115 and the semiconductor poles 130, which are exposed via the second holes 135 of FIG. 9 and the tunnels 140 of FIG. 9. The storage media 150 may be obtained by sequentially forming a tunneling insulating layer 142, a charge storing layer 144, and a blocking insulating layer 146. Next, a conductive layer 155 may be formed on the storage media 150. For example, the storage media 150 and the conductive layer 155 may be obtained using chemical vapor deposition or an electroplating method having good step coverage.

A reactive source for forming the conductive layer 155 may be supplied in a direction from the top of the second holes 135 to the bottom thereof. Thus, in order to form the conductive layer 155 in the tunnels 140 of FIG. 4 without causing a void, the second holes 135 should not be blocked before the tunnels 140 are filled with the conductive layer 155. This condition may be primarily satisfied by forming at least two separated string selection transistors, i.e., the string selection transistors TS1 and TS2, and at least two separated ground selection transistors, i.e., the ground selection transistors TG1 and TG2, as described above with reference to FIG. 3. It is possible to control the gate lengths of a string selection gate electrode 166, a control gate electrode 164, and a ground selection gate electrode 166 illustrated in FIG. 11 by controlling the widths of the second holes 135 and the tunnels 140 as described above with reference to FIG. 3.

Figure 11:
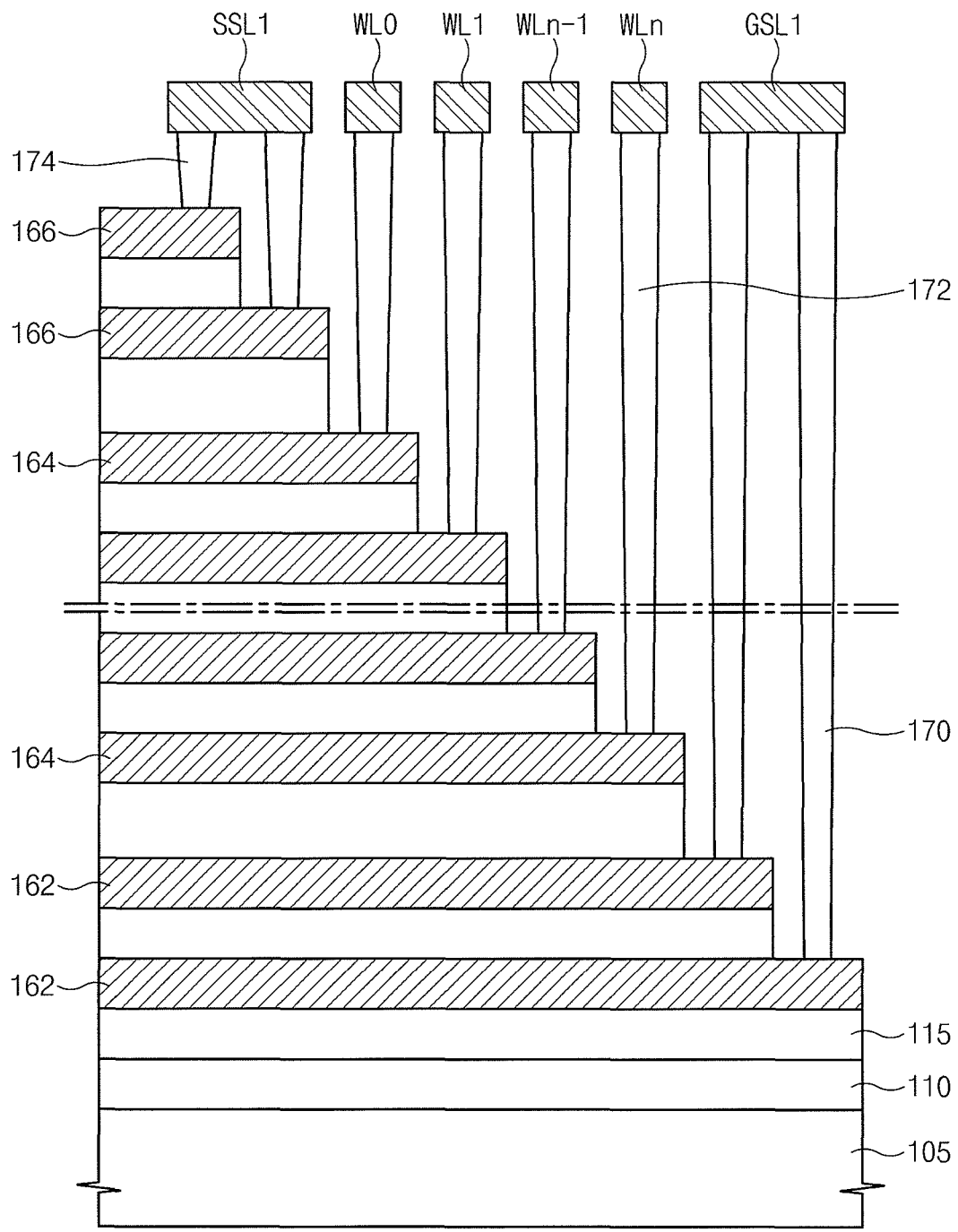

Referring to FIG. 11, the conductive layer 155 of FIG. 10 that is exposed via the second holes 135 may be selectively etched in order to form the ground selection gate electrodes 162, the control gate electrodes 164, and the string selection gate electrodes 166.

Figure 12:
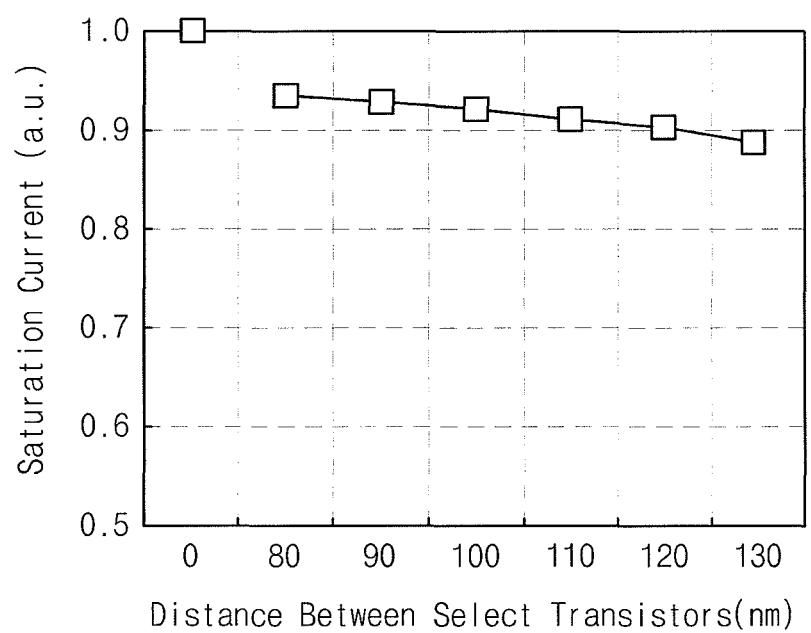

Referring to FIG. 12, the string selection gate electrodes 166 may be commonly connected to a first string selection line SSL1 via contact plugs 174. The control gate electrodes 164 may be connected to word lines WL0, WL1, through WLn-1, and WLn via contact plugs 172. The ground selection gate electrodes 162 may be connected to a first ground selection line GSL1 via contact plugs 170.

Figure 13:
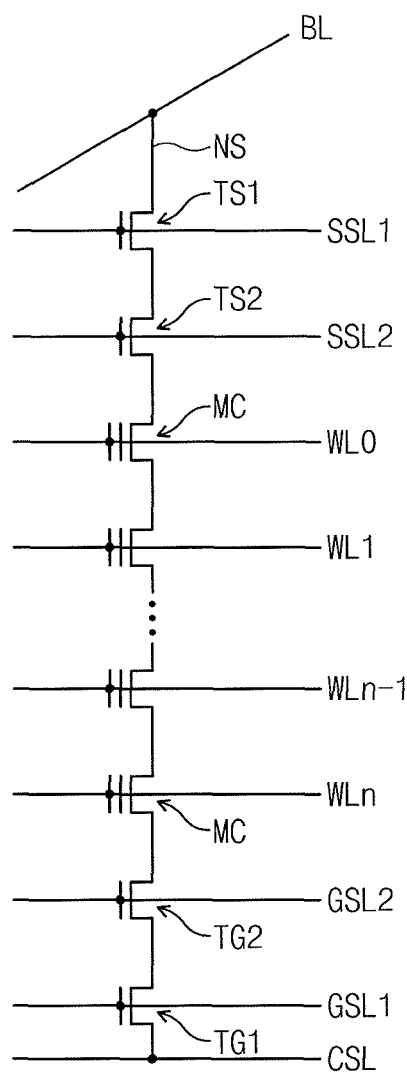
FIG. 13 is a third embodiment of a circuit diagram of a non-volatile memory device, according to aspects of the inventive concept.

FIG. 13 is a circuit diagram of a non-volatile memory device according to still another embodiment of the inventive concept. The non-volatile memory device according to this embodiment has some elements partially modified from the non-volatile memory devices of FIGS. 1A through 4, and overlapping description thereof will be omitted.

Referring to FIG. 13, at least one pair of first and second string select transistors TS1, TS2 may be arranged adjacent to each other at one side of memory cells MC. For example, the string selection transistors TS1 and TS2 may be located between the bit line BL and the memory cells MC, and may be connected in series with the memory cells MC. A first string select line SSL1 may be coupled to the first string select transistors TS1 and a second string select line SSL2 may be coupled to the second string select transistors TS2. Therefore, unlike in FIG. 1A or FIG. 1B, the first and second string select transistors TS1, TS2 may be separated and operated independently.

At least one pair of first and second ground select transistors TG1, TG2 may be arranged adjacent to each other at an end of the NAND string NS that is opposite the string select transistors TS1, TS2, at the other side of the memory cells MC. For example, ground selection transistors TG1, TG2 may be located between the common source line CSL and the memory cells MC, and may be connected in series with the memory cells MC. A first ground select line GSL1 may be coupled to the first ground select transistors TG1 and a second ground select line GSL2 may be coupled to the second ground select transistors TG2. Therefore, unlike in FIG. 1A or FIG. 1B, the first and second ground select transistors TG1, TG2 may be separated and operated independently. In a modified example of this embodiment, the first and second ground select transistors TG1, TG2 may be coupled to a single ground select line GSL, e.g., as in FIG. 1A or FIG. 1B.

Hereinafter, an embodiment of an operating method useful with this embodiment of a non-volatile memory device will be described.

In this example, for program operation, 0V or an operating voltage may be applied to a bit line BL and 0V may be applied to the common source line GSL. When 0V is applied to the bit line BL, this NAND string NS is selected for program. However, when an operating voltage is applied to the bit line BL, a program of this NAND string NS is prevented by a channel boosting.

A program voltage may be applied to a select memory cell among the memory cells MC and a pass voltage may be applied to the remaining memory cells. The pass voltage may be lower than the program voltage and may be higher than a threshold voltage of the memory cells MC. The program voltage may be selected such that charges are injected into the memory cells MC by F-N tunneling.

An Off-voltage may be applied to the first and second ground select lines GSL1, GSL2. A first voltage may be applied to the second string select line SSL2 directly adjacent to the memory cells MC, and a second voltage may be applied to the first string select line SSL1 directly adjacent to the bit line BL. The second voltage may be selected as low as possible so as to lower an Off current while turning on the first string select transistor. For example, the second voltage may be higher than or equal to a threshold voltage of the first string select transistor TS1 and may be equal to the foregoing operating voltage.

The first voltage may be selected to decrease a voltage difference between the second string select transistor TS2 and the memory cell MC adjacent thereto. For example, the first voltage may be substantially equal to the pass voltage. Thus, by setting the first voltage to be higher than the second voltage, by decreasing a difference between the pass voltage and the first voltage, a situation can be prevented wherein a leakage current to the second string select transistor TS2 adjacent to the memory cells MC is generated and thus a channel boosting efficiency is decreased.

Accordingly, in this embodiment of an operating method of the non-volatile memory device, by independently operating the first string select transistor TS1 and the second string select transistor TS2, an Off current and a leakage current can be decreased at the same time. A function to prevent a leakage will be described in more detail with reference to FIGS. 14 through 16.

Figure 14:
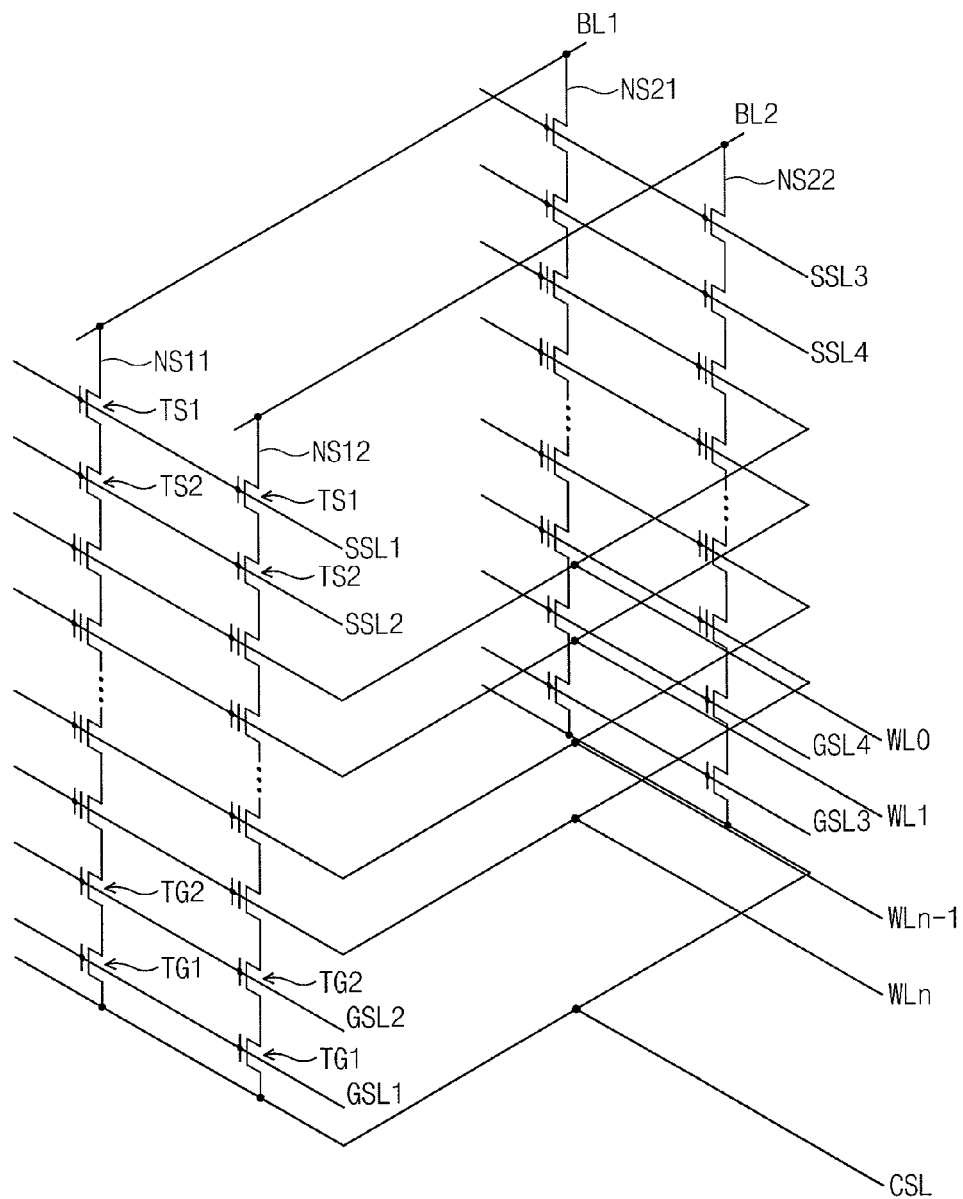
FIG. 14 is a fourth embodiment of a circuit diagram of a non-volatile memory device, according to aspects of the inventive concept.

FIG. 14 is a circuit diagram of a non-volatile memory device according to another embodiment of the inventive concept. The non-volatile memory device according to this embodiment may correspond to an array configuration using the non-volatile memory device of FIG. 13. Accordingly, overlapping description between two embodiments will be omitted.

Referring to FIG. 14, a plurality of NAND strings NS11, NS12, NS21, NS22 having a vertical structure may be arranged in a matrix configuration. A first bit line BL1 may be commonly connected to one end of each of the NAND strings NS11, NS21 arranged in a first column, and a second bit line BL2 may be commonly connected to one end of each of the NAND strings NS12, NS22 arranged in a second column. A common source line CSL may be commonly connected to the other end of the NAND strings NS11, NS12, NS21, NS22, opposite the first and second bit lines BL1, BL2. The number of the NAND strings NS11, NS12, NS21, NS22 and the number of the bit lines BL1, BL2 are exemplarily shown, and do not limit the scope of this embodiment or the invention.

Word lines WL0, WL1 . . . WLn–1, WLn may be commonly connected with memory cells MC arranged in the in their respective layers. A first string select line SSL1 may be commonly coupled to the first string select transistors TS1 of the NAND strings NS11, NS12 arranged on a first row. A second string select line SSL2 may be commonly coupled to the second string select transistors TS2 of the NAND strings NS11, NS12 arranged in the first row. A third string select line SSL3 may be commonly coupled to the first string select transistors TS1 of the NAND strings NS11, NS12 arranged in a second row. A fourth string select line SSL4 may be commonly coupled to the second string select transistors TS2 of the NAND strings NS11, NS12 arranged in the second row.

A first ground select line GSL1 may be commonly coupled to the first ground select transistors TG1 of the NAND strings NS11, NS12 arranged on the first row. A second ground select line GSL2 may be commonly coupled to the second ground select transistors TG2 of the NAND strings NS11, NS12 arranged in the first row. A third ground select line GSL3 may be commonly coupled to the first ground select transistors TG1 of the NAND strings NS11, NS12 arranged on the second row. A fourth ground select line GSL4 may be commonly coupled to the second ground select transistors TG2 of the NAND strings NS11, NS12 arranged in the second row.

FIG. 15 shows a voltage bias condition when a program operation is performed in the memory device of FIG. 14. In this program operation example, it is assumed that one of the memory cells in the first NAND string NS11 arranged in the first row is programmed. That is, it is assumed that the second NAND string NS arranged in the first row and the NAND and the NAND strings NS21, NS22 arranged in the second row are prevented from being programmed.

Referring to FIGS. 14 and 15, since the memory cell in the first NAND string NS11 arranged in the first row is programmed, a ground voltage Vss is supplied to the first bit line BL1 connected with the first NAND string NS11. The first NAND string NS21 of the second row is also connected with the first bit line BL1 to which the ground voltage Vss is provided.

Since the second NAND string NS12 arranged in the first row is prevented from being programmed, a power voltage Vcc is supplied to the second bit line BL2 connected with the second NAND string NS12. The second NAND string NS22 of the second row is also connected with the second bit line BL2 to which the power voltage Vcc is supplied.

Since the first NAND string NS11 of the first row is programmed, a turn-on voltage is supplied to the first and second string select line SSL1, SSL2 connected with the first NAND string NS11. The turn-on voltage may be a voltage to turn on the first and second string select transistors TS1, TS2 of the first NAND string NS11. For example, the turn-on voltage may be the power voltage Vcc.

The first and second string select transistors TS1, TS2 of the second NAND string of the first row are also connected with the first and second select lines SSL1, SSL2, respectively. Accordingly, the first and second string select transistors TS1, TS2 of the second NAND string of the first row are turned on.

The first and second NAND strings NS21, NS22 of the second row are prevented from being programmed. For example, a turn-off voltage is supplied to the third and fourth string select lines SSL3, SSL4. The turn-off voltage is a voltage to turn off the first and second string select transistors TS1, TS2 of the first and second NAND strings NS21, NS22. For example, the turn-off voltage is a ground voltage Vss.

A program voltage Vpgm and a pass voltage Vpass are supplied to the word lines WL0-WLn. For example, the program voltage Vpgm is supplied to the word line connected with a selected memory cell. The pass voltage Vpass is supplied to the word lines connected with non-selected memory cells. The program voltage Vpgm and the pass voltage Vpass are a high voltage, e.g., 8 volts or more in this embodiment.

A channel is formed in the memory cells of the first and second NAND strings NS21, NS22 arranged in the second row by high voltages (Vpgm and Vpass) applied to the word lines WL0-WLn. A voltage of the formed channel is boosted by the high voltages (Vpgm and Vpass). At this time, the ground voltage Vss is applied to gates of the second string select transistors TS2 of the first and second NAND strings NS21, NS22 arranged in the second row. Accordingly, due to a voltage difference between a gate voltage (e.g., ground voltage Vss) and a drain voltage (e.g., boosted channel voltage) of the second string select transistors TS2 of the first and second NAND strings NS21, NS22, a gate induced drain leakage (GIDL) may be generated.

Also, the ground voltage Vss is applied to the second bit line BL2 connected with the second NAND string NS22 arranged in the second row. Due to a voltage difference between a bit line voltage (e.g., ground voltage Vss) connected with the second NAND string NS22 and the boosted channel voltage, an additional leakage in the second NAND string NS22 may be generated.

To solve the foregoing limitations, there is provided a method of controlling a voltage of string select lines of a memory device according to an embodiment of the inventive concept. As a result, the leakage current may be controlled.

FIG. 16 is a table showing results of a method of controlling a voltage according to an embodiment of the inventive concept. Referring to FIGS. 14 and 16, a third voltage V3 is supplied to the third string select line SSL3. That is, the third voltage V3 is applied to the gates of the first string select transistors TS1 of the first and second NAND strings NS21, NS22 arranged in the second row. For example, the third voltage V3 is a voltage to turn off the first string select transistors TS1 of the first and second NAND strings NS21, NS22.

A fourth voltage V4 is supplied to the fourth string select line SSL4. That is, the fourth voltage V4 is applied to the gates of the second string select transistors TS2 of the first and second NAND strings NS21, NS22 arranged in the second row. For example, the fourth voltage V4 is a voltage to turn off the second string select transistors TS2 of the first and second NAND strings NS21, NS22.

As a difference between the fourth voltage V4 and the boosted channel voltage of the first and second NAND strings NS21, NS22 decreases, a GIDL (gate induced drain leakage) that may be generated in the second string select transistors TS2 of the first and second NAND strings NS21, NS22 decreases. The level of the fourth voltage V4 is set to prevent or decrease a GIDL generated in the second string select transistors TS2 of the first and second NAND strings NS21, NS22. For example, the fourth voltage V4 may have a level higher than the ground voltage Vss. For example, the fourth voltage V4 may have a level between the ground voltage Vss and a threshold voltage of the second string select transistor TS2.

The lower the level of the third voltage V3 is, the less the charges leaked to the bit lines BL1, BL2 through the first string select transistors TS1 of the first and second NAND strings NS21, NS22 are. The level of the third voltage V3 may be set to prevent or decrease a leakage through the first string select transistors TS1 of the first and second NAND strings NS21, NS22. For example, the third voltage V3 may have a level lower than the ground voltage Vss.

As described above, if the level of a voltage supplied to string select lines (e.g., SSL3, SSL4) of NAND strings (e.g., NS21, NS22) arranged in a row different from a programmed NAND string (e.g., NS11) is controlled, a leakage that may be generated in the NAND strings (e.g., NS21, NS22) arranged in a row different from the programmed NAND string (e.g., NS11) is prevented or decreased. Accordingly, the reliability of memory devices is enhanced.

Also, while maintaining the leakage amount, i.e., maintaining the reliability of memory devices, the level of a voltage supplied to the word lines adjacent to the string select transistors TS1, TS2 may be elevated. That is, while maintaining the reliability of memory devices, a voltage window of the word lines adjacent to the string select transistors TS1, TS2 can be enhanced.

In FIG. 16, it has been described that the fourth voltage V4 is a turn-off voltage. However, the fourth voltage V4 may be a voltage to turn on the second string select transistors TS2 of the first and second NAND strings NS21, NS22 arranged in the second row. For example, the fourth voltage V4 may have a level higher than a threshold voltage of the second string select transistors TS2 of the first and second NAND strings NS21, NS22. For example, the fourth voltage V4 may have a level lower than the pass voltage Vpass. The fourth voltage V4 may have a level equal to the pass voltage Vpass. The fourth voltage V4 may have a level higher than the pass voltage Vpass.

Figure 17:
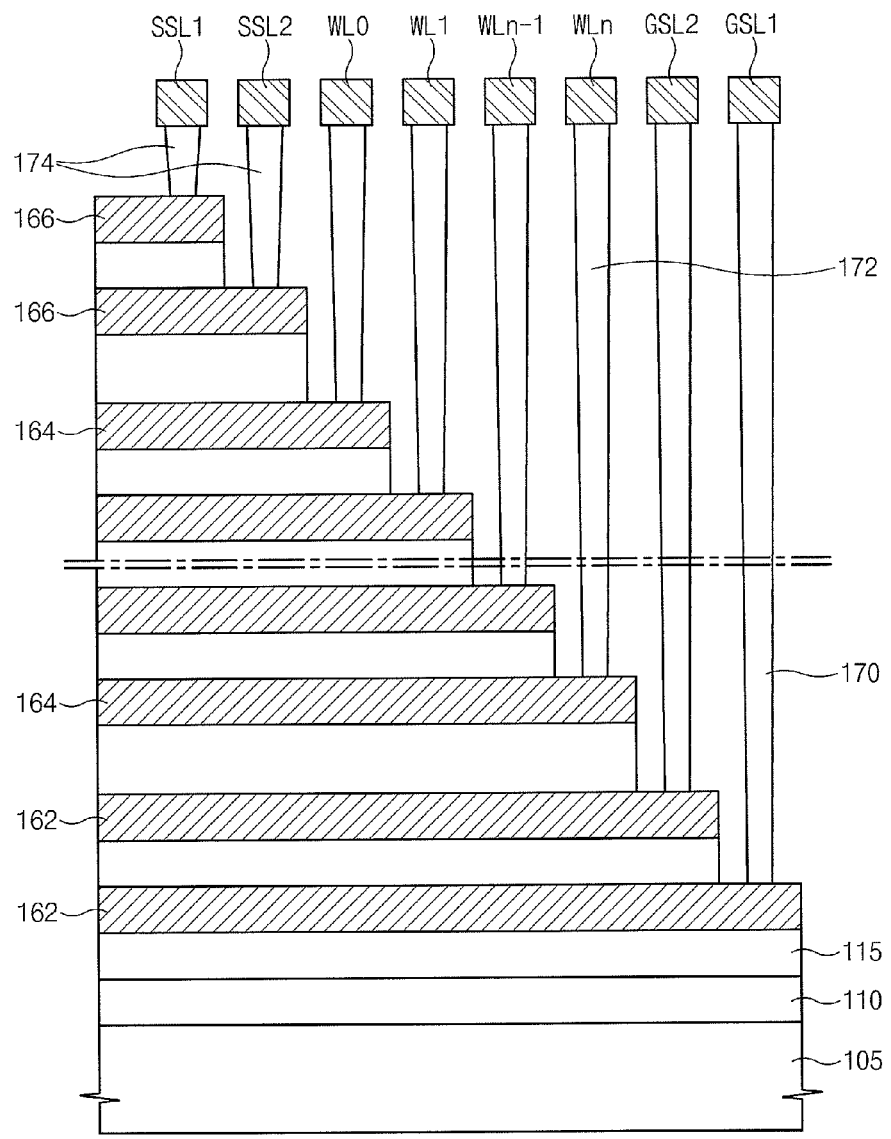
FIG. 17 is an embodiment of a schematic cross-sectional view of the non-volatile memory device of FIG. 14, taken from a direction of bit lines.

FIG. 17 is a schematic sectional view taken along a bit line direction of the non-volatile memory device of FIG. 14, according to an embodiment of the inventive concept. Referring to FIG. 17, string select gate electrodes 166 may be respectively connected with a first string select line SSL1 and a second string select line SSL2 through contact plugs 174. Ground select gate electrodes 162 may be respectively connected with a first ground select line GSL1 and a second ground select line GSL2 through contact plugs 170.

Figure 18:
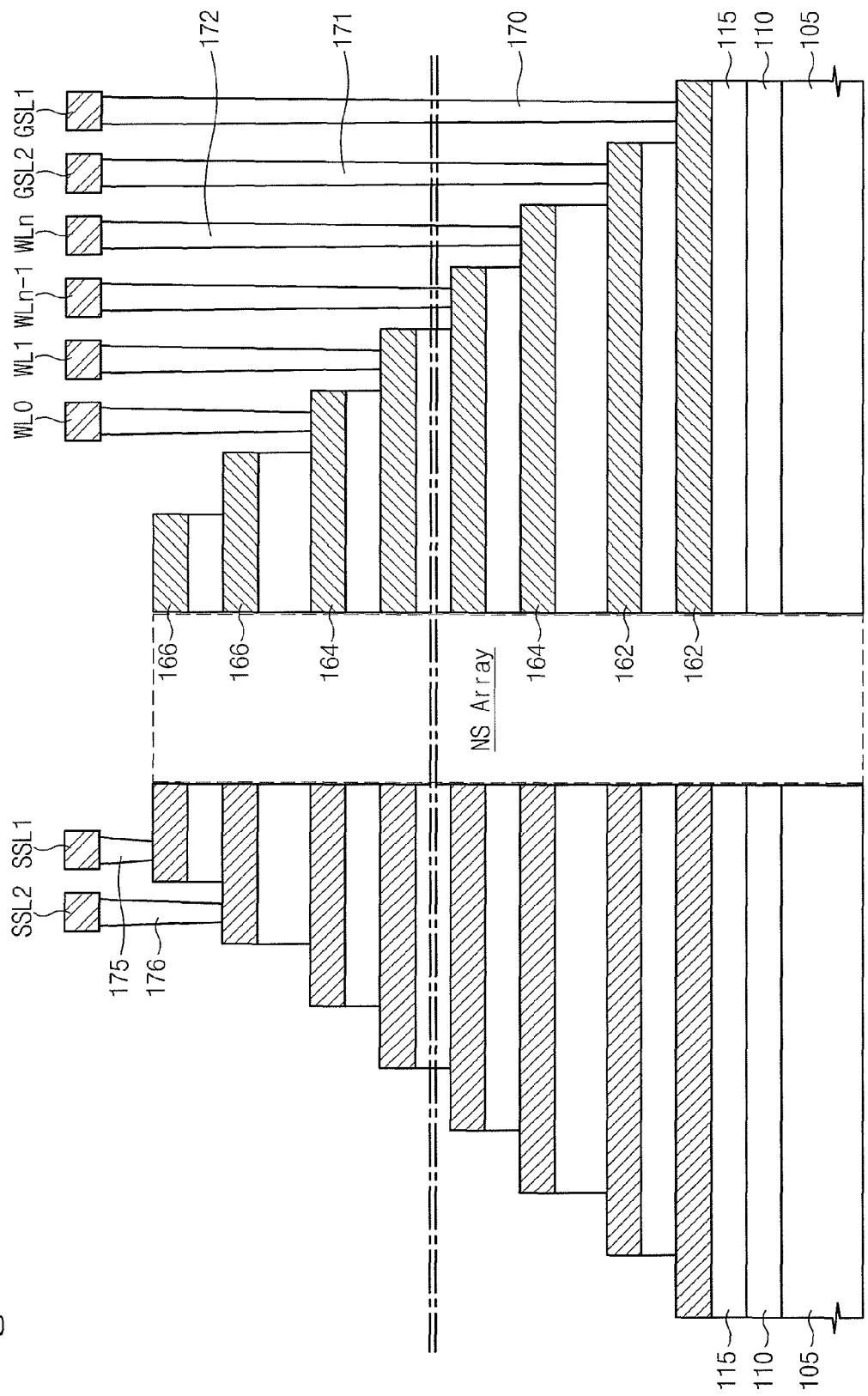
FIG. 18 is another embodiment of a schematic cross-sectional view of the non-volatile memory device of FIG. 14, taken from a direction of bit lines.

FIG. 18 is a schematic sectional view taken along a bit line direction of the non-volatile memory device of FIG. 14 according to another embodiment of the inventive concept. For simple description, a NAND string array portion is omitted. Referring to FIG. 18, ground select gate electrodes 162 are respectively connected with first and second ground select lines GSL1, GSL2 through contact plugs 170, 171 at one side of the NAND string array. Also, control gate electrodes 164 are respectively connected with word lines WL0-WLn through contact plugs 172 at one side of the NAND string array. String select gate electrodes 166 are respectively connected with first and second string select lines SSL1, SSL2 through contact plugs 175, 176.

As an example, the string select lines SSL1, SSL2, the word lines WL0-WLn, and the ground select lines GSL1, GSL2 may be formed on the same layer. For example, the string select lines SSL1, SSL2, the word lines WL0-WLn, and the ground select lines GSL1, GSL2 may be formed in a metal layer. For example, the string select lines SSL1, SSL2, the word lines WL0-WLn, and the ground select lines GSL1, GSL2 may be formed in a metal-0 layer or metal-1 layer.

Figure 19:
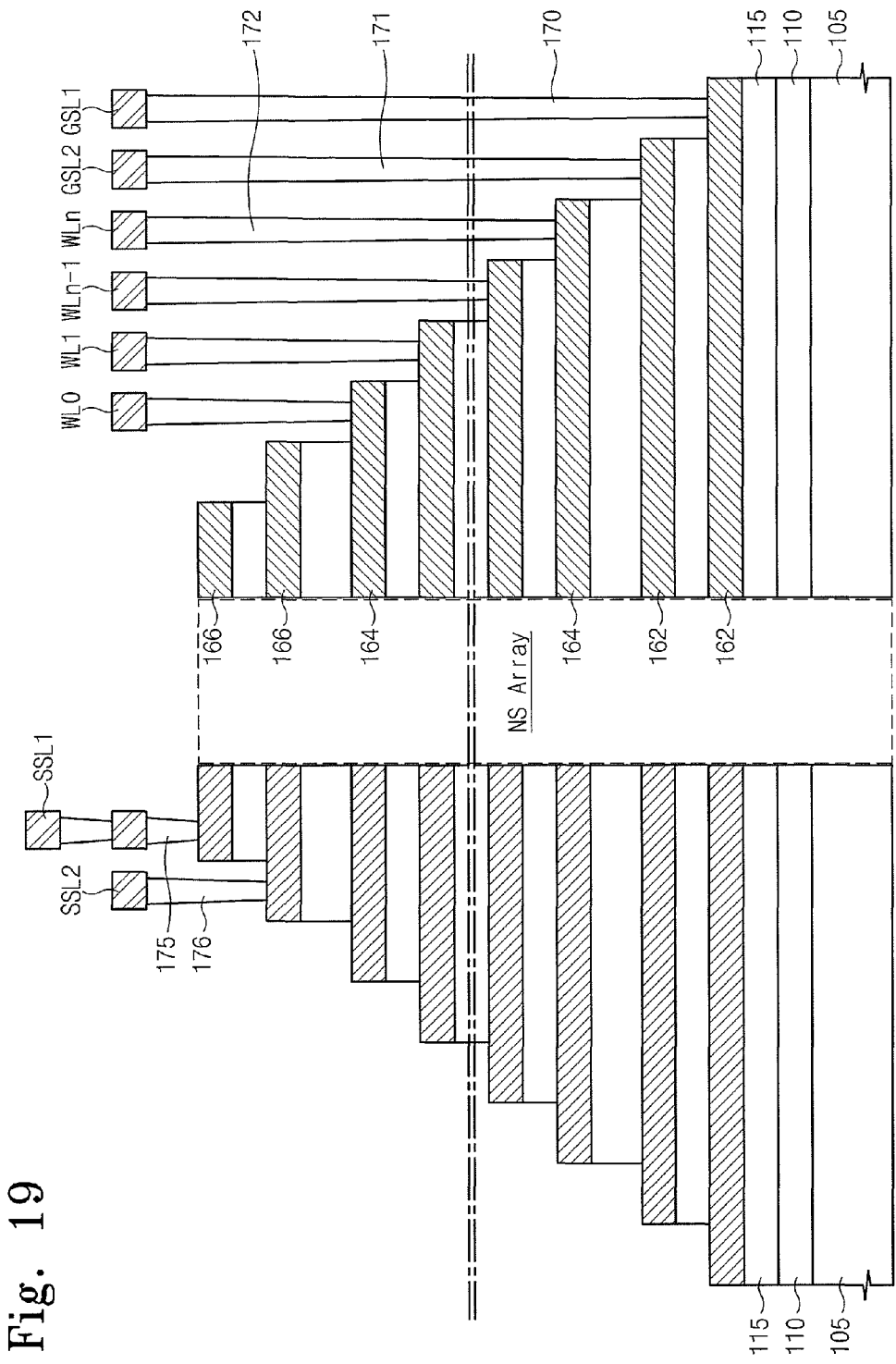
FIG. 19 is yet another embodiment of a schematic cross-sectional view of the non-volatile memory device of FIG. 14, taken from a direction of bit lines.

FIG. 19 is a schematic sectional view taken along a bit line direction of the non-volatile memory device of FIG. 14 according to still another embodiment of the inventive concept. Comparing the schematic sectional view of FIG. 19 with that of FIG. 18, in FIG. 19, a first string select line SSL1 and a second string select line SSL2 are formed in different layers. As an example, the first string select line SSL1 is formed in a layer above a layer in which the second string select line SSL2 is formed. For example, the first string select line SSL1 is formed on a metal-1 layer. The second string select line SSL2 is formed in a metal-0 layer.

Figure 20:
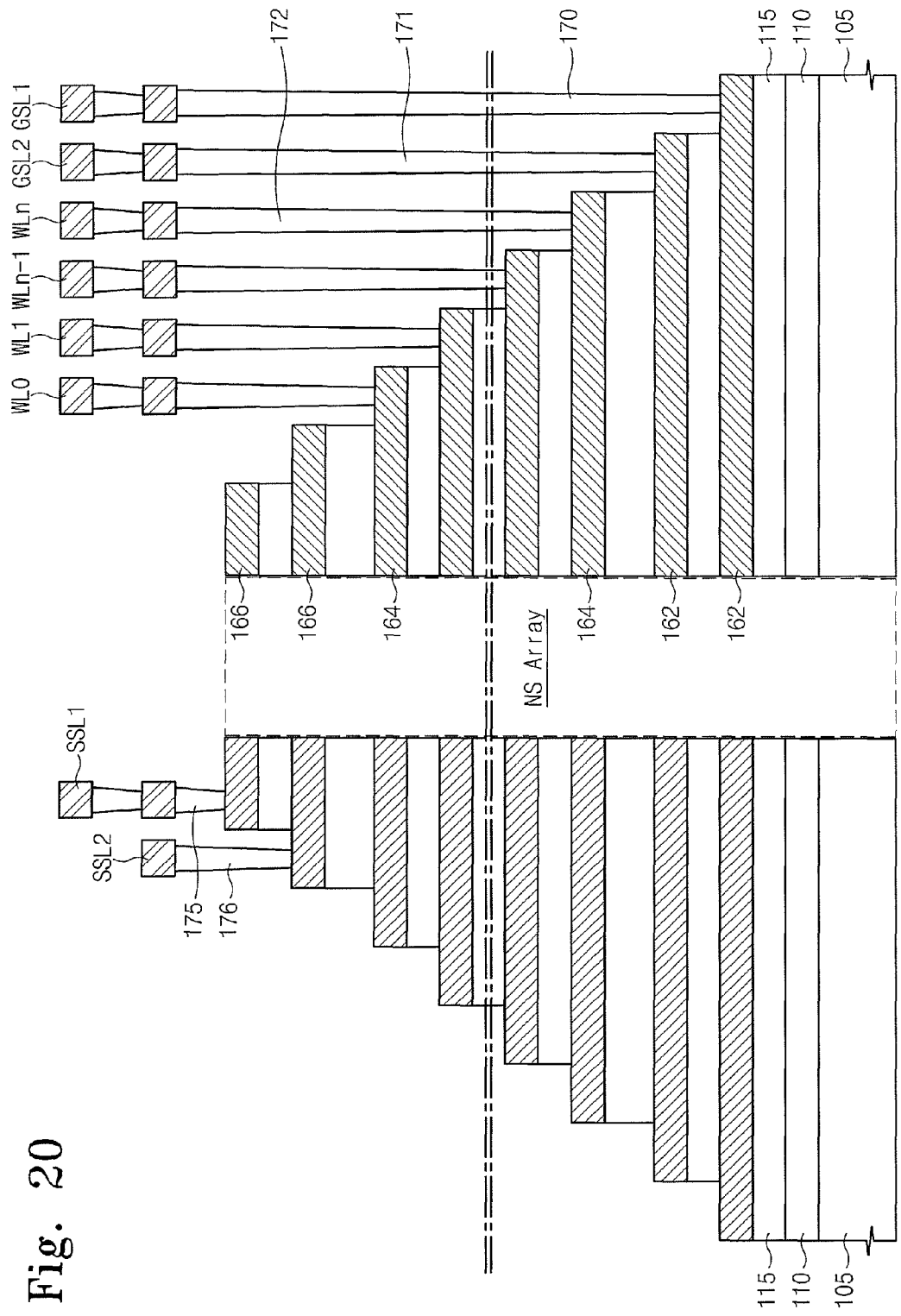
FIG. 20 is yet another embodiment of a schematic sectional view of the non-volatile memory device of FIG. 14, taken from a direction of bit lines.

FIG. 20 is a schematic sectional view taken along a bit line direction of the non-volatile memory device of FIG. 14 according to even another embodiment of the inventive concept. Comparing the schematic sectional view of FIG. 20 with that of FIG. 19, in FIG. 20, word lines WL0-WLn, ground select lines GSL1, GSL2, and a first string select line SSL1 are formed in the same layer. For example, the word lines WL0-WLn, the ground select lines GSL1, GSL2, and the first string select line are formed in a metal-1 layer. A second string select line SSL2 is formed in a layer below the first string select line SSL1. For example, the second select line SSL2 is formed in a metal-0 layer.

Figure 21:
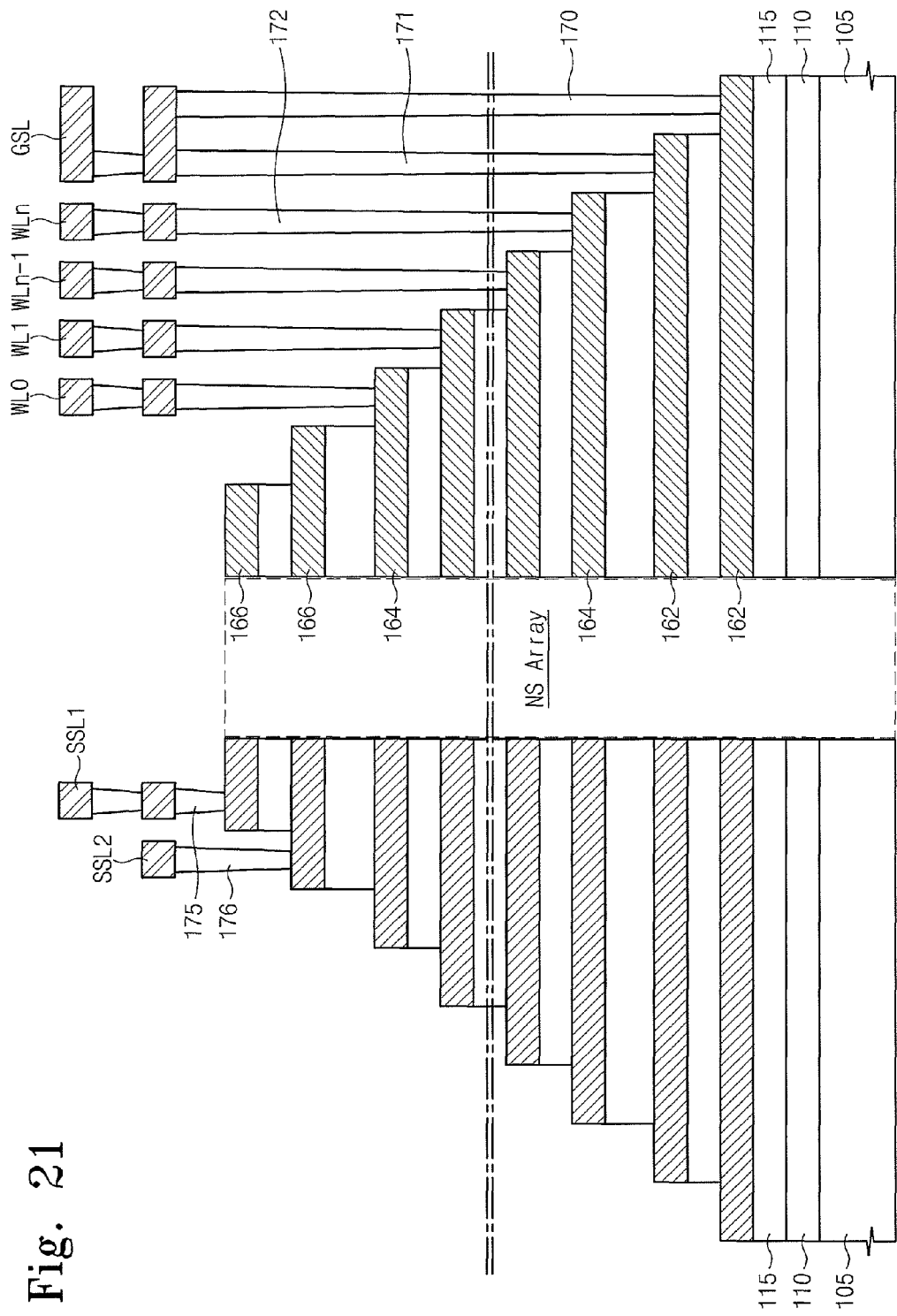
FIG. 21 is yet another embodiment of a schematic sectional view of the non-volatile memory device of FIG. 14, taken from a direction of a bit line.

FIG. 21 is a schematic sectional view taken along a bit line direction of the non-volatile memory device of FIG. 14 according to yet another embodiment of the inventive concept. Comparing the schematic sectional view of FIG. 21 with that of FIG. 20, in FIG. 21, ground select gate electrodes 162 are connected with a single ground select line GSL. That is, like the memory device described with reference to FIGS. 1A to 2, ground select transistors TG1, TG2 are connected commonly with the ground select line GSL.

A first string select line SSL1, word lines WL0-WLn, and the ground select line GSL are formed in the same layer. For example, the first string select line SSL1, the word lines WL0-WLn, and the ground select line GSL are formed in a metal-1 layer. A second string select line SSL2 is formed in a layer below the first string select line SSL1. For example, the second select line SSL2 is formed in a metal-0 layer.

Figure 22:
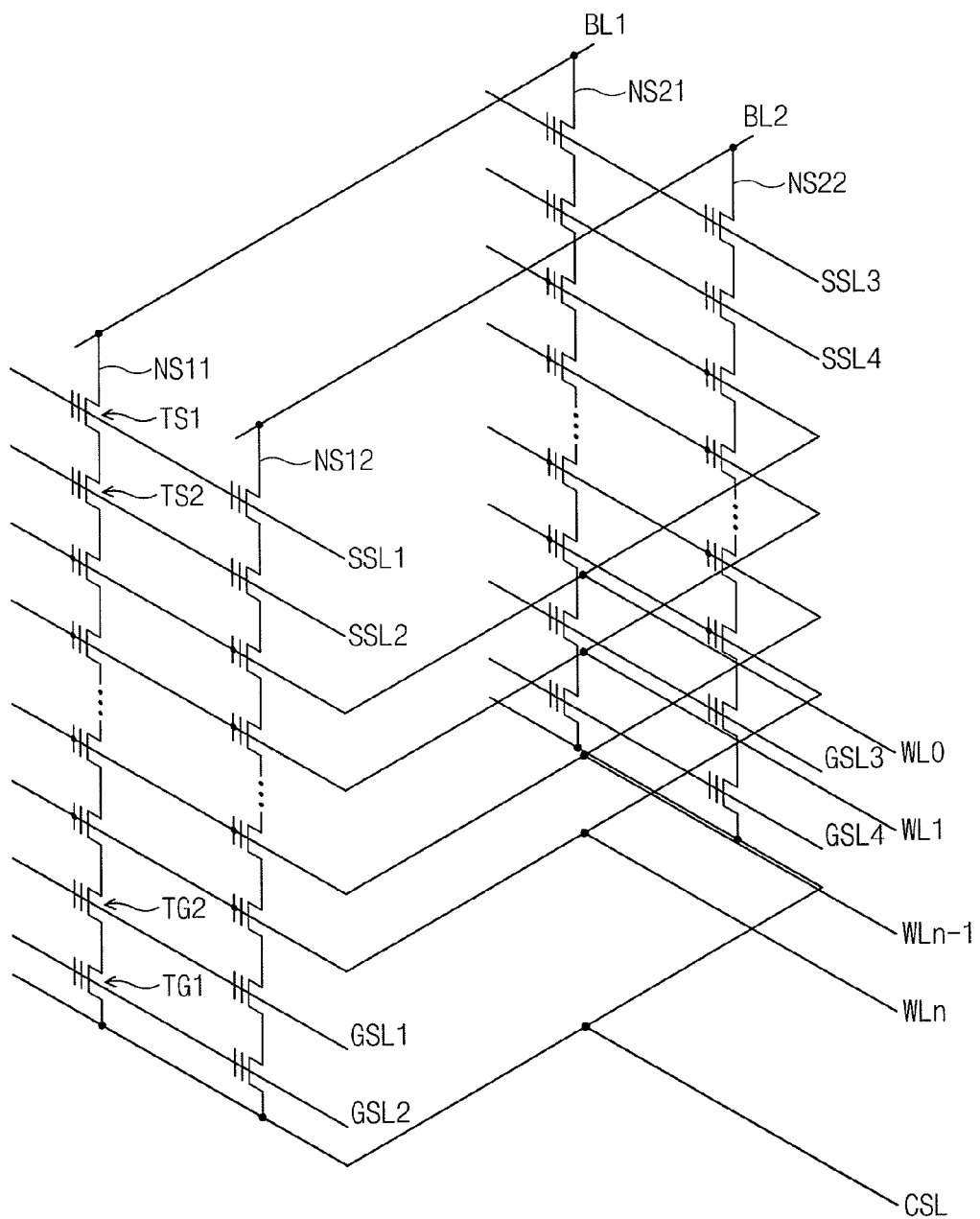
FIG. 22 is fifth embodiment of a circuit diagram of a non-volatile memory device, according to aspects of the inventive concept.

FIG. 22 is a circuit diagram of a non-volatile memory device according to another embodiment of the inventive concept. Compared with the memory device shown in FIG. 14, charge storage layers are provided to select transistors TS1, TS2, TG1, TG2 of the memory device shown in FIG. 22, like memory cells. That is, the select transistors TS1, TS2, TG1, TG2 and the memory cells have the same structure. As an example, the charge storage layers provided to the select transistors TS1, TS2, TG1, TG2 and the memory cells can be charge trap layers.

Figure 23:
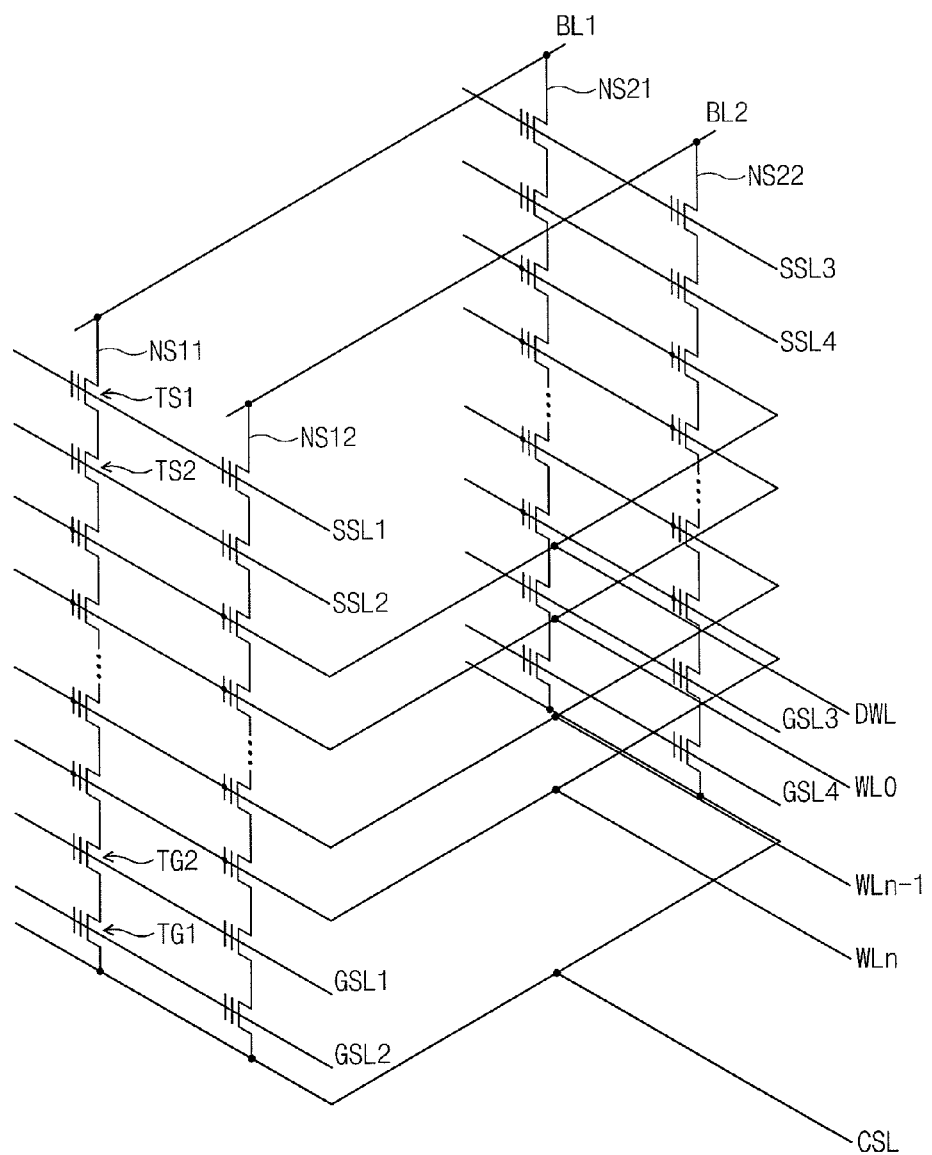
FIG. 23 is sixth embodiment of a circuit diagram of a non-volatile memory device, according to aspects of the inventive concept.

FIG. 23 is a circuit diagram illustrating a non-volatile memory device according to yet another embodiment of the inventive concept. In comparison with the non-volatile memory device of FIG. 22, the non-volatile memory device of FIG. 23 further comprises a dummy word line DWL between string select lines SSL1 to SSL4 and normal word lines WL0 to WLn. In an embodiment, a dummy pass voltage may be applied into the dummy word line DWL during a program operation. For example, a level of the dummy pass voltage may be lower than a level of a normal pass voltage.

In an embodiment, two or more dummy word lines can be provided between the string select lines SSL1 to SSL4 and the normal word lines WL0 to WLn.

Figure 24:
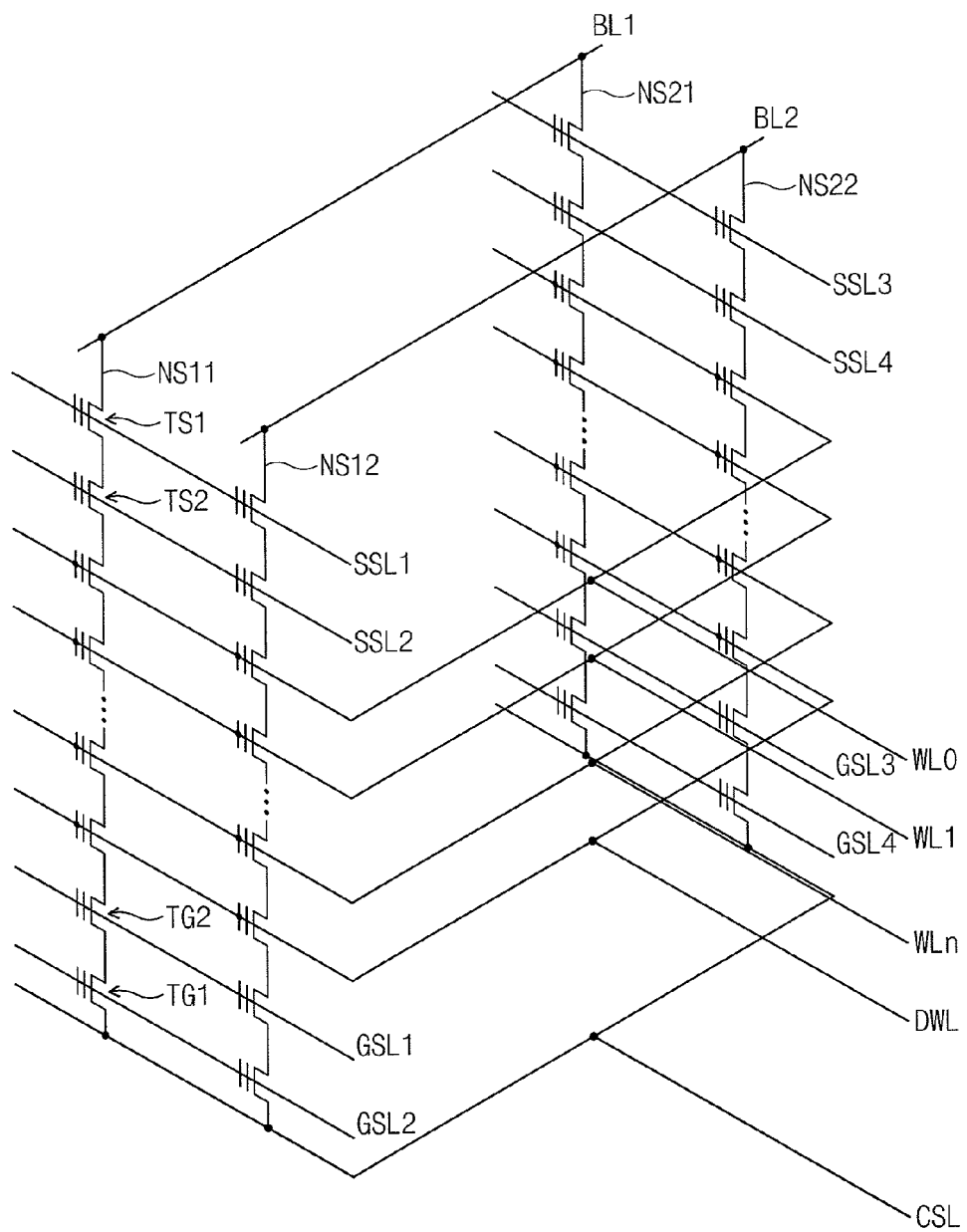
FIG. 24 is a seventh embodiment of a circuit diagram of a non-volatile memory device, according to aspects of the inventive concept.

FIG. 24 is a circuit diagram illustrating a non-volatile memory device according to still another embodiment of the inventive concept. In comparison with the non-volatile memory device of FIG. 22, the non-volatile memory device of FIG. 24 further comprises a dummy word line DWL between ground select lines GSL1 to GSL4 and normal word lines WL0 to WLn. In an embodiment, a dummy pass voltage may be applied into the dummy word line DWL during a program operation. For example, a level of the dummy word line DWL may be lower than a level of a normal pass voltage.

In an embodiment, two or more dummy word lines can be provided between the ground select lines GSL1 to GSL4 and the normal word lines WL0 to WLn.

Figure 25:
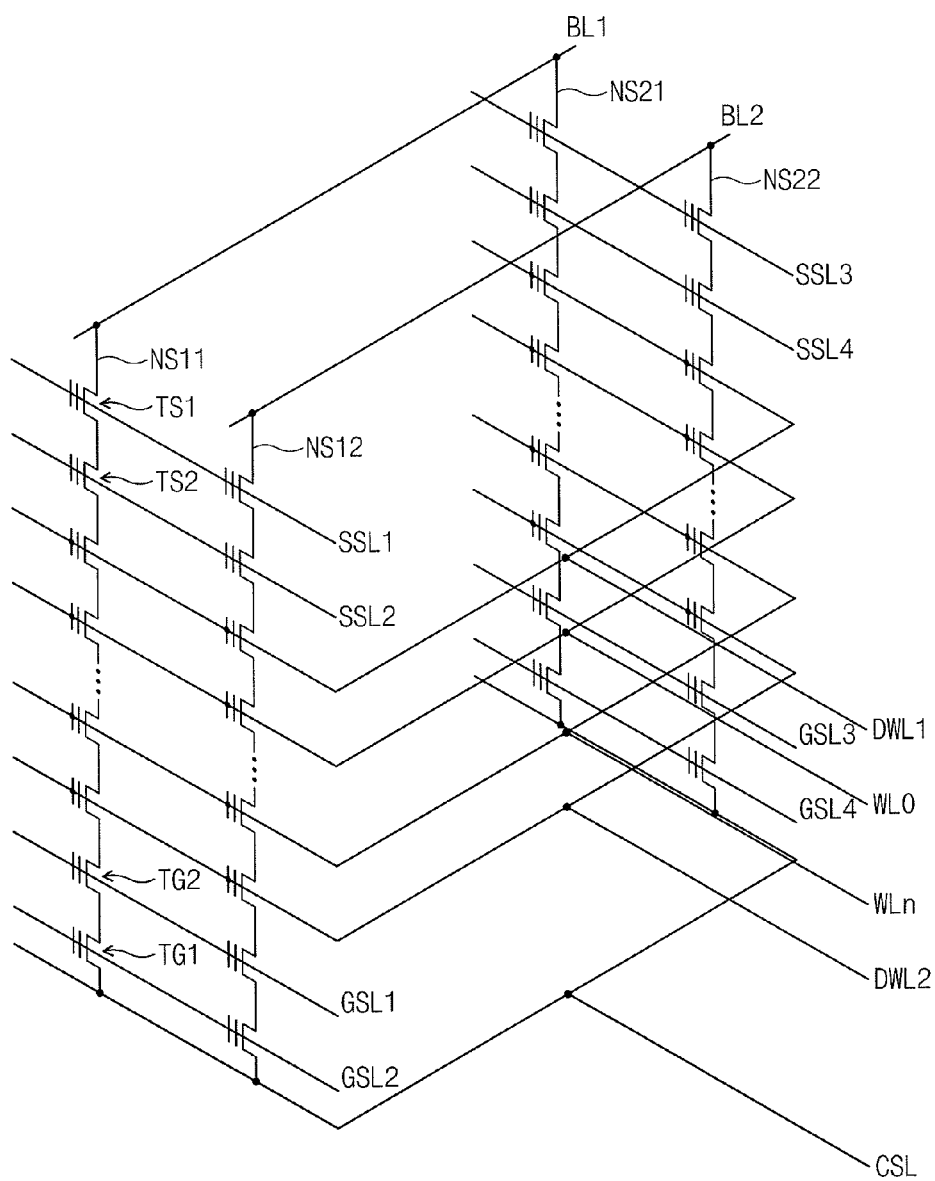
FIG. 25 is an eighth embodiment of a circuit diagram of a non-volatile memory device, according to aspects of the inventive concept.

FIG. 25 is a circuit diagram illustrating a non-volatile memory device according to another embodiment of the inventive concept. Comparing with the non-volatile memory device of FIG. 22, the non-volatile memory device of FIG. 25 further comprises a first dummy word line DWL1 between string select lines SSL1 to SSL4 and normal word lines WL0 to WLn and a second dummy word line DWL2 between ground select lines GSL1 to GSL4 and the normal word lines WL0 to WLn. In an embodiment, a dummy pass voltage may be applied into the first and second dummy word lines DWL1 and DWL2 during a program operation. For example, a level of the dummy pass voltage may be lower than a level of a normal pass voltage.

In an embodiment, two or more dummy word lines can be provided between the string select lines SSL1 to SSL4 and the normal word lines WL0 to WLn. In an embodiment, two or more dummy word lines can be provided between the ground select lines GSL1 to GSL4 and the normal word lines WL0 to WLn.

Figure 26:
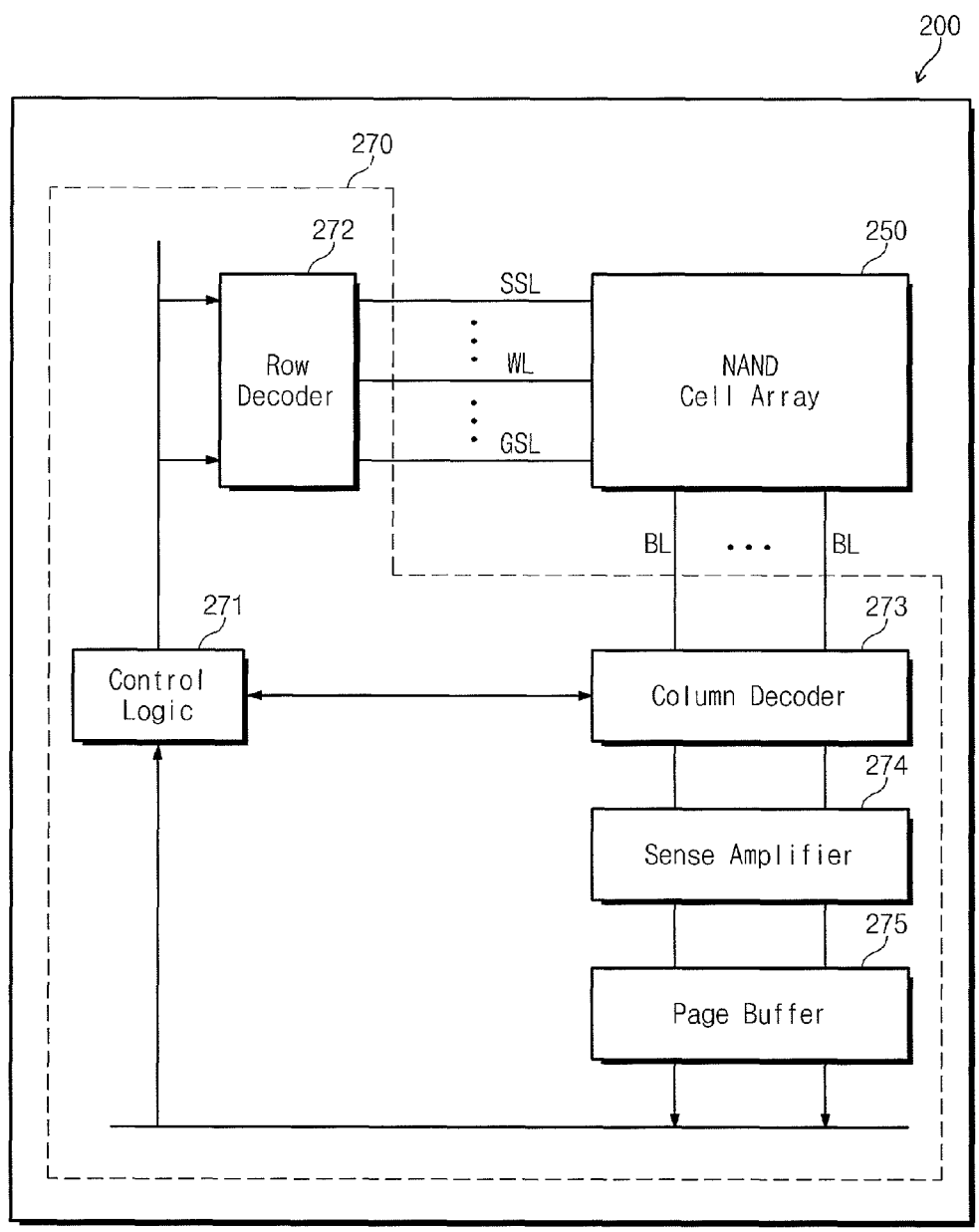
FIG. 26 is a block diagram of another embodiment of a non-volatile memory device according to aspects of the inventive concept.

FIG. 26 is a schematic block diagram illustrating a memory device 200 including a non-volatile memory device according to another embodiment of the inventive concept. Referring to FIG. 26, a NAND cell array 250 may be coupled with a core circuit unit 270. For example, the NAND cell array 250 may include the non-volatile memory device described with reference to FIGS. 1A through 25. The core circuit unit 270 may include a control logic 271, a row decoder 272, a column decoder 273, a sense amplifier 274 and/or a page buffer 275.

The control logic 271 may communicate with the row decoder 272, the column decoder 273 and/or the page decoder 275. The row decoder 272 may communicate with the NAND cell array 250 having a stack structure through string select lines SSL, word lines WL and/or ground select lines GSL. The column decoder 273 may communicate with the NAND cell array 250 through bit lines BL. The sense amplifier 274 may be connected with the column decoder 273 when a signal is outputted from the NAND cell array 250, and may not be connected with the column decoder 273 when a signal is transferred to the NAND cell array 250.

For example, the control logic 271 may transfer a row address signal to the row decoder 272, and the row decoder 272 may decode the row address signal and transfer the decoded row address signal to the NAND cell array 250 through the string select lines SSL, the word lines WL and the ground select lines GSL. The control logic 271 may transfer a column address signal to the column decoder 273 or the page buffer 275, and the column decoder 273 may decode the column address signal and transfer the decoded column address signal to the NAND cell array 250 through the bit lines BL. A signal of the NAND cell array 250 may be transferred to the sense amplifier 274 through the column decoder 273 and amplified, and the signal amplified in the sense amplifier 274 may be transferred to the control logic 271 via the page buffer 275.

Figure 27:
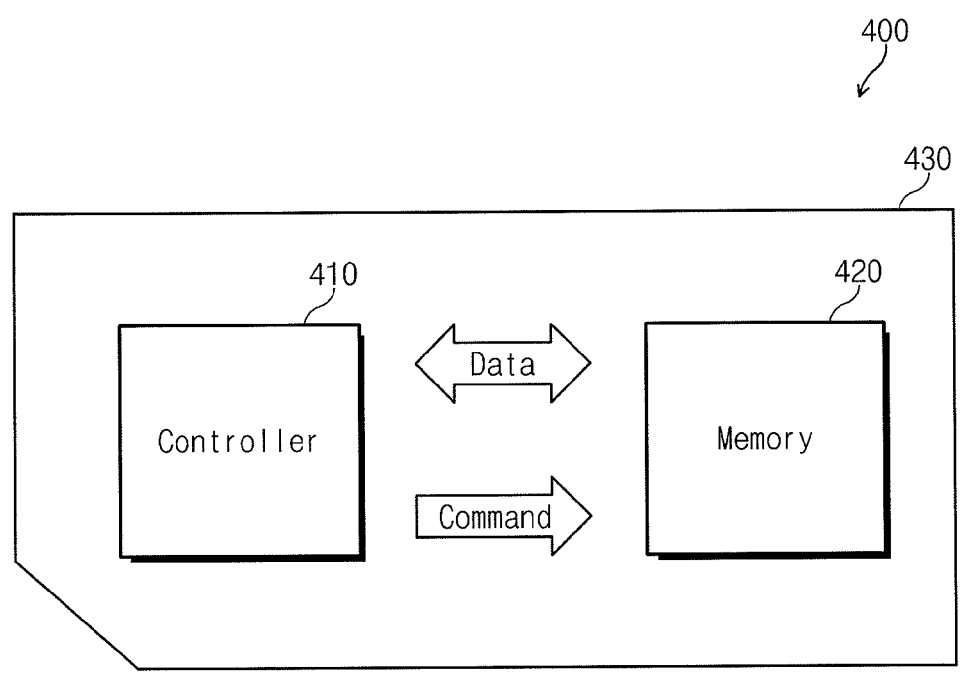
FIG. 27 is a schematic view of an embodiment of a memory card, according to aspects of the inventive concept.

FIG. 27 is a schematic view of a memory card 400 according to an embodiment of the inventive concept. Referring to FIG. 27, the memory card 400 may include a controller 410 and a memory 420 formed or maintained in a housing 430, or the like. The controller 410 and the memory 420 may exchange an electrical signal. For example, according to a command of the controller 410, the controller 410 may exchange data with the memory 420. Therefore, the memory card 400 may store data in the memory 420 or may output data from the memory 420.

For example, the memory 420 may include the non-volatile memory device described with reference to FIG. 1A through FIG. 25. The memory card 400 may be used as a data storage medium for various portable devices. For example, the memory card 400 may include a multimedia card (MMC) or a secure digital card (SD).

Figure 28:
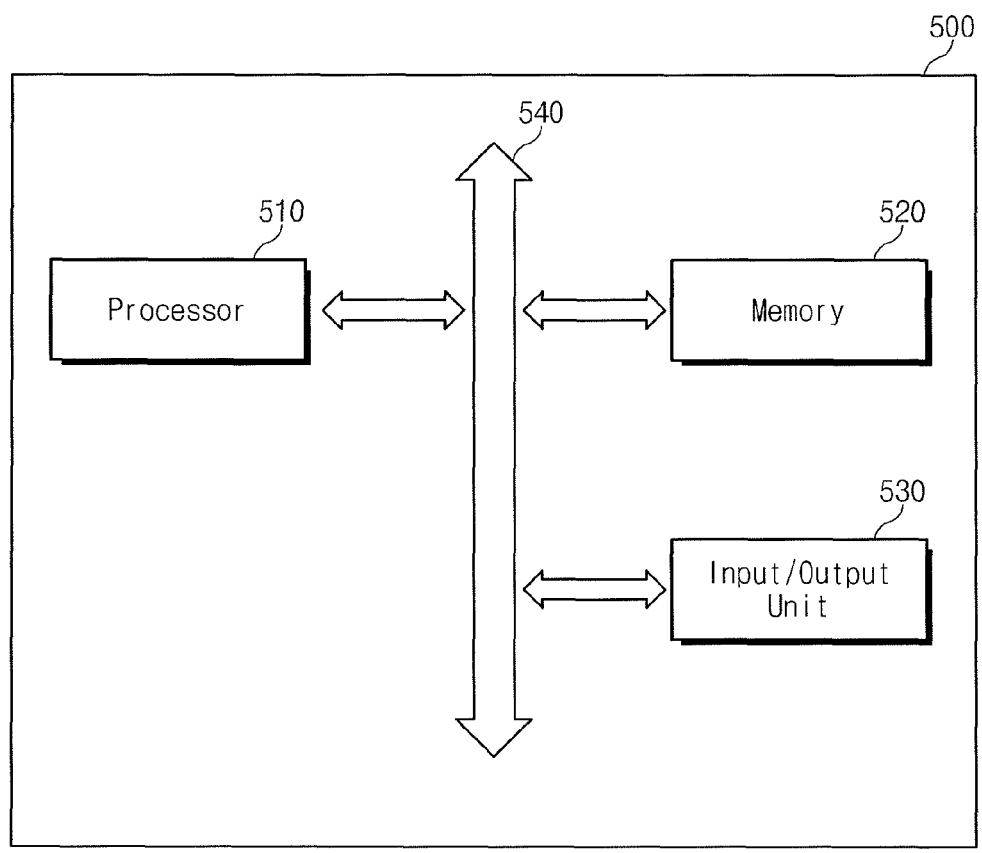
FIG. 28 is a block diagram of an embodiment of an electronic system, according to aspects of the inventive concept.

FIG. 28 is a block diagram of an electronic system 500 according to an embodiment of the inventive concept. Referring to FIG. 28, the electronic system may include a processor 510, a memory chip 520, and an input/output unit 530, which can perform data communication by using a bus 540. The processor 510 may execute a program and control the electronic system 500. The input/output unit 530 may be used to input or output data of the electronic system 500. The electronic system 500 may be connected with an external device, for example, a personal computer or a network by using the input/output unit 530 to exchange data with the external device. For example, the memory 520 may include the non-volatile memory device described with reference to FIG. 1A through FIG. 25.

For example, the electronic system 500 may constitute various electronic controllers needing the memory 520, and may be used, for example, in mobile phones, MP3 players, navigations, solid state disks (SSD), household appliances, or the like.

Figure 29:
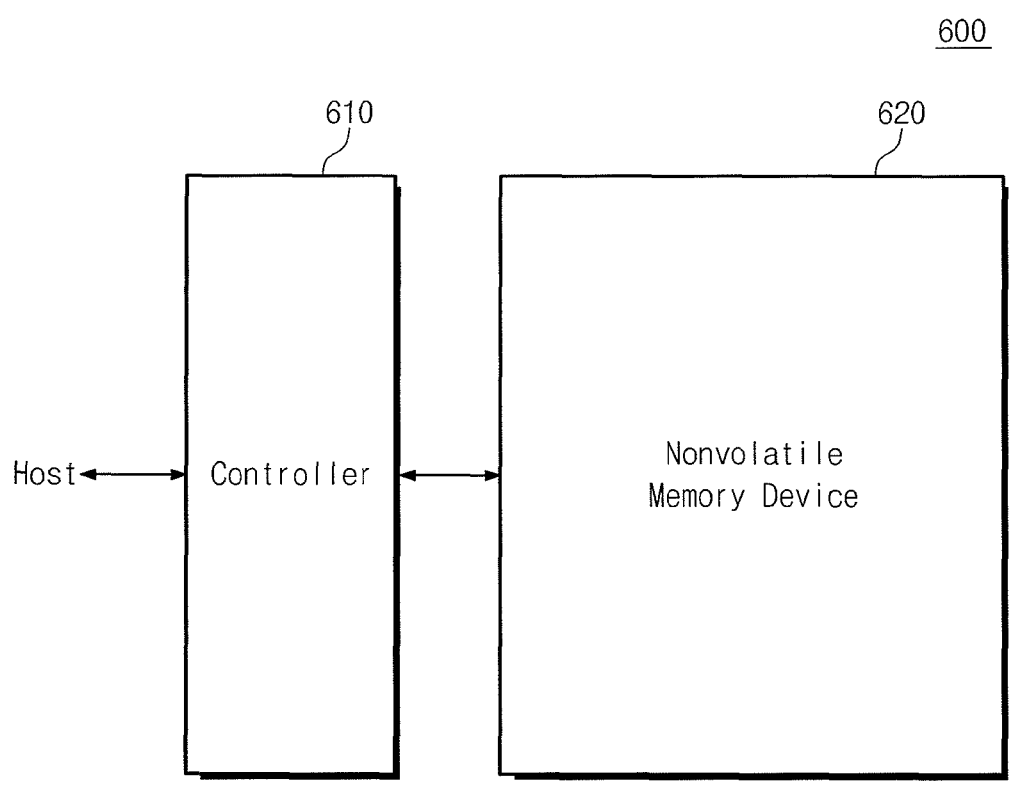
FIG. 29 is a block diagram of an embodiment of a memory system provided with a non-volatile memory apparatus including a non-volatile memory device described with reference to FIG. 1A through FIG. 25.

FIG. 29 is a block diagram of a memory system 600 provided with a non-volatile memory apparatus 620 including the non-volatile memory device described with reference to FIGS. 1A through 25. Referring to FIG. 29, the memory system 600 includes a non-volatile memory device 620 and a controller 610.

The controller 610 is connected with a host and the non-volatile memory device 620. In response to a request from the host, the controller 610 is configured to access the non-volatile memory device 620. For example, the controller 610 is configured to control read, write, erase, and background operations of the non-volatile memory device 620. The controller 610 is configured to provide an interface between the non-volatile memory device 620 and the host. The controller 610 is configured to operate firmware for controlling the non-volatile memory device 620.

As an example, the controller 610 further includes publicly known elements, such as a random access memory (RAM), a processing unit, a host interface, and a memory interface. The RAM is used as at least one of an operating memory of the processing unit, a cache memory between the non-volatile memory device 620 and the host, and a buffer memory between the non-volatile memory device 620 and the host. The processing unit controls an overall operation of the controller 610.

The host interface includes a protocol for performing data exchange between the host and the controller 610. As an example, the controller 610 is configured to communicate with an external device (e.g., host) through at least one of various interface protocols such as a USB (Universal Serial Bust) protocol, an MMC (Multimedia Card) protocol, a PCI (Peripheral Component Interconnection) protocol, a Serial-ATA protocol, a Parallel-ATA protocol, an SCSI (Small Computer Small Interface) protocol, an ESDI (Enhanced Small Disk Interface) protocol, an IDE (Integrated Drive Electronics) protocol, etc. The memory interface interfaces with the non-volatile memory device 620. For example, the memory interface includes a NAND interface or a NOR interface.

The memory system 600 may be configured to further include an error correction block. The error correction block can be configured to detect an error of data read from the non-volatile memory device 620 and correct the error. As an example, the error correction block can be provided as an element constituting the controller 610.

The controller 610 and the non-volatile memory device may be integrated into a single semiconductor device. Exemplarily, the controller 610 and the non-volatile memory device 620 may be integrated into a single semiconductor device to constitute a memory card as described with reference to FIG. 27. For example, the controller 610 and the non-volatile memory device 620 can be integrated into a single semiconductor device to constitute a memory card, such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), a universal flash storage (UFS), or the like.

The controller 610 and the non-volatile memory device 620 can be integrated into a single semiconductor device to constitute a solid state drive (SSD). The SSD includes a storage unit configured to store data in a semiconductor memory. In the case where the memory system 600 is used as the SSD, the operating speed of the host connected with the memory system 600 is remarkably improved.

As another example, the memory system 600 can be provided as one of various elements constituting an electronic device, such as a computer, a portable computer, an UMPC (Ultra Mobile PC), a workstation, a net-book, a PDA (Personal Digital Assistant), a web tablet, a wireless phone, a mobile phone, a smart phone, an e-book, a PMP (Portable Multimedia Player), a PSP (Playstation Portable), a navigation device, a black box, a digital camera, a DMB (Digital Multimedia Broadcasting) player, a digital audio recorder, a digital audio player, a digital picture recorder, a digital picture player, a digital video recorder, a digital video player, a device capable of transmitting and/or receiving information in wireless environment, one of various electronic devices constituting a home network, an RFID device, one of various elements constituting a computing system, or the like.

As an example, the non-volatile memory device 610 or the memory system 600 may be mounted in various types of packages. Examples of the packages of the non-volatile memory device 610 or the memory system 600 may include a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline package (TSOP), a system in package (SIP), a multi chip package (MCP), a wafer-level fabricated package (WFP), a wafer-level processed stack package (WSP), and so on.

Figure 30:
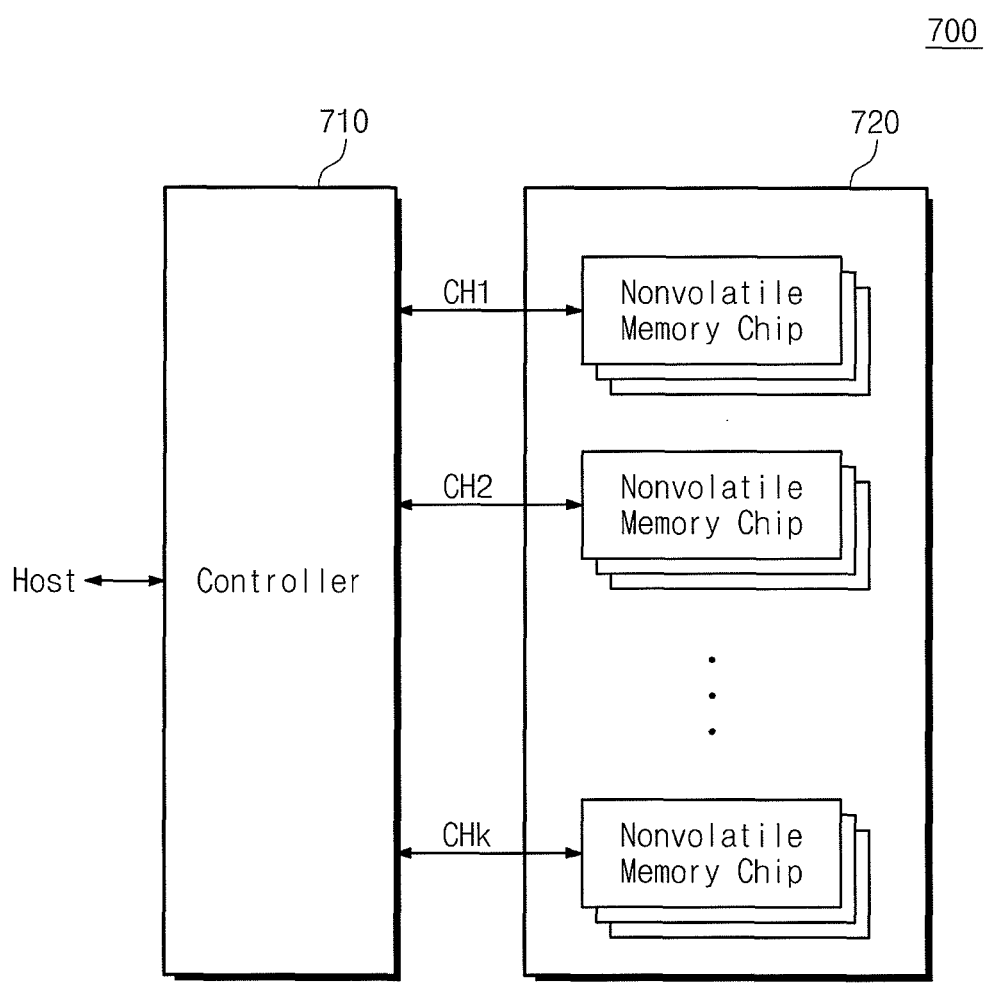
FIG. 30 is a block diagram showing an embodiment of an application example of the memory system of FIG. 29.

FIG. 30 is a block diagram showing an application example of the memory system of FIG. 29. Referring to FIG. 30, the memory system 700 includes a non-volatile memory device 720 and a controller 710. The non-volatile memory device 720 includes a plurality of non-volatile memory chips. The plurality of non-volatile memory chips are divided into a plurality of groups. Each group of the plurality of non-volatile memory chips is configured to communicate with the controller 710 through a single common channel. FIG. 30 shows that the plurality of non-volatile memory chips communicate with the controller 710 through channel 1 (CH1) through channel k (CHk). Each non-volatile memory chip includes the non-volatile memory device described with reference to FIG. 1A through FIG. 25.

Figure 31:
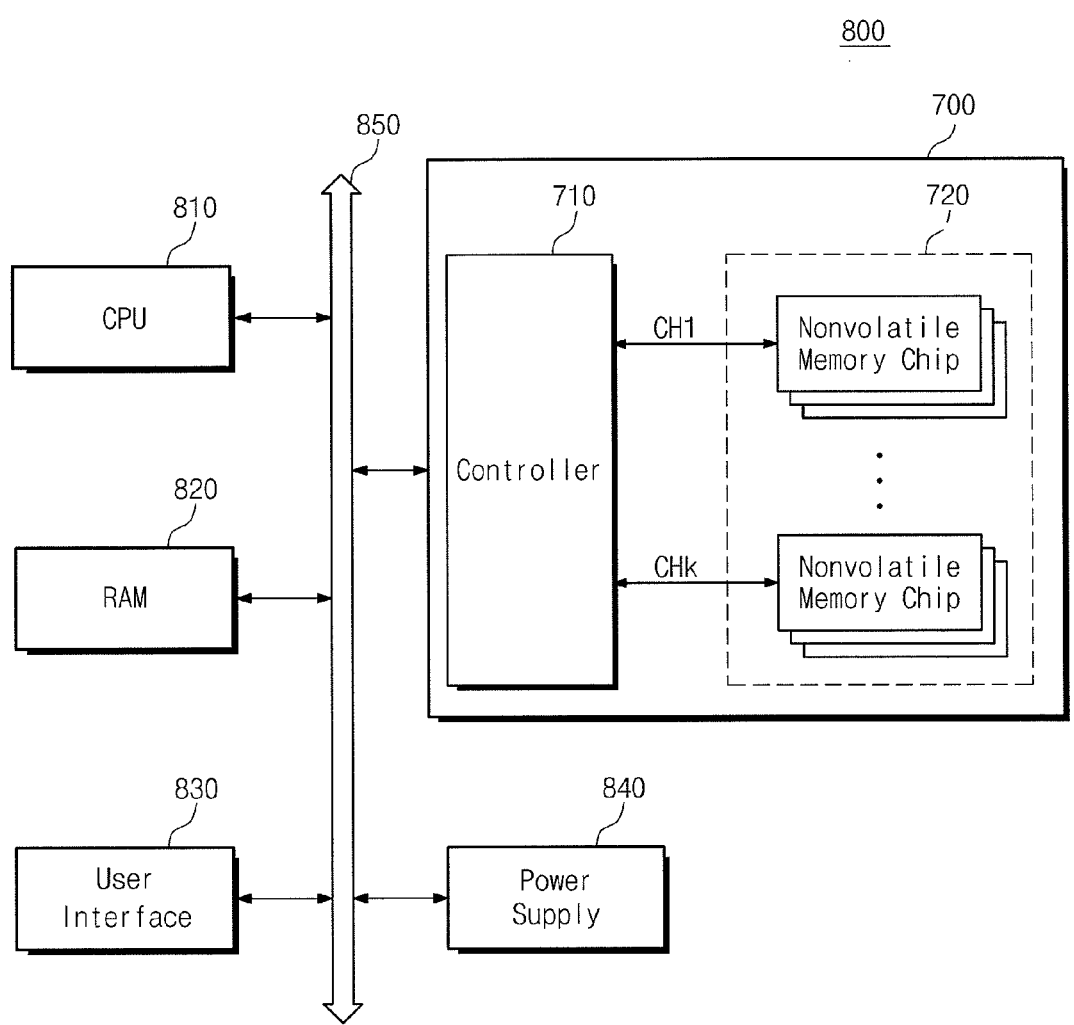
FIG. 31 is a block diagram of an embodiment of a computing system including the memory system described with reference to FIG. 30.

FIG. 31 is a block diagram of a computing system 800 including the memory system 700 described with reference to FIG. 30. Referring to FIG. 31, the computing system 800 includes a central processing unit (CPU) 810, a random access memory (RAM) 820, a user interface 830, a power supply 840, and the memory system 700.

The memory system 700 is electrically connected with the CPU 810, the RAM 820, the user interface 830 and the power supply 840 through a system bus 850. Data, which is provided through the user interface 830 or processed by the CPU 810, is stored in the memory system 700. The memory system 700 includes the controller 710 and the non-volatile memory device 720.

While FIG. 31 shows that the non-volatile memory device 720 is connected with the system bus 850 through the controller 710, the non-volatile memory device 720 may be configured to be directly connected with the system bus 850.

In FIG. 31, it has been described that the non-volatile memory device 700 includes the plurality of non-volatile memory chips. However, the non-volatile memory device 700 may include one non-volatile memory chip. Also, the non-volatile memory device 700 includes a plurality of non-volatile memory chips each having an inherent channel, in this embodiment.

According to the non-volatile memory devices of the embodiments of the inventive concepts, by designing the number of the string select transistors to be at least two, the string select gate electrodes can greatly reduce gate lengths thereof compared with a case where the number of the string select transistor is one, so that spaces between the interlayer dielectrics can be filled without any voids. Also, by designing the number of the ground select transistors to be at least two, the ground select gate electrodes can greatly reduce gate lengths thereof compared with a case where the number of the string select transistor is one, so that spaces between the interlayer dielectrics can be filled without any voids. Furthermore, by adjusting gate lengths of the string select transistors, memory cells and ground select transistors and spacing between gate electrodes thereof, formation of voids can be further suppressed. Accordingly, the reliability of the string select transistors, memory cells, and ground select transistors can be enhanced.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A non-volatile memory device comprising:
a memory cell array; and
a peripheral circuit configured to access the memory cell array,
wherein the memory cell array includes:
    a substrate;
    a plurality of memory cell groups arranged in rows and columns on the substrate, each memory cell group including a plurality of memory cells stacked in series;
    a plurality of first select transistor groups coupled between the substrate and the plurality of memory cell groups respectively; and
    a plurality of second select transistor groups respectively coupled between the plurality of memory cell groups and a plurality of bit lines,
    wherein the plurality of memory cell groups, the plurality of first select transistor groups, and the plurality of second select transistor groups form a plurality of memory cell strings extending from the substrate, each memory cell string comprising a first select transistor group coupled between a first end of a memory cell group and the substrate and a second select transistor group coupled between a second end of the memory cell group and a bit line,
wherein the peripheral circuit is configured to independently drive second select transistors of a second select transistor group corresponding to an unselected memory cell group of the plurality of memory cell groups during a program operation, and
wherein a second select transistor group of a selected memory cell group is configured to receive a turn-on voltage during the program operation.

2. The non-volatile memory device of claim 1, wherein the peripheral circuit is further configured to drive the second select transistors of the second select transistor group with different voltages during a program operation.

3. The non-volatile memory device of claim 1, wherein a specific second select transistor of the second select transistor group is driven with a first voltage, and another second select transistor of the second select transistor group provided between the specific second select transistor and the unselected memory cell group is driven with a second voltage higher than the first voltage during a program operation.

4. The non-volatile memory device of claim 3, wherein the first voltage has a level higher than a ground voltage.

5. The non-volatile memory device of claim 3, wherein the second voltage has a level to turn on the another second select transistor.

6. The non-volatile memory device of claim 3, wherein the second voltage has a level to turn off the another second select transistor.

7. The non-volatile memory device of claim 1, wherein second select transistors of each second select transistor group are connected to the peripheral circuit through different metal layers respectively.

8. The non-volatile memory device of claim 1, wherein first select transistors of each first select transistor group are driven commonly.

9. The non-volatile memory device of claim 1, wherein first select transistors of each first select transistor group are connected commonly on a metal layer.

10. The non-volatile memory device of claim 1, wherein memory cells having identical sequence from the substrate are driven commonly.

11. The non-volatile device of claim 1, wherein memory cells having identical sequence from the substrate are connected commonly on a metal layer.

12. A memory system comprising:
a non-volatile memory device; and
a controller configured to control the non-volatile memory device,
wherein the non-volatile memory device includes a memory cell array and a peripheral circuit configured to access the memory cell array,
wherein the memory cell array includes a plurality of memory cell strings having 3 dimensional structure, each memory cell string including at least two first select transistors coupled between a substrate and a first end of a serially connected memory cell group and at least two second select transistors coupled between a bit line and a second end of the memory cell group,
wherein the peripheral circuit is configured to drive the at least two second select transistors of an unselected memory cell string of the plurality of memory cell strings with different voltages during a program operation, and
wherein at least two second select transistors of a selected memory cell string is configured to receive a turn-on voltage during the program operation.

13. The memory system of claim 12, wherein a specific second select transistor of the at least two second select transistors of the unselected memory cell string is driven with a first voltage, and another second select transistor of the at least two second select transistors of the unselected memory cell string provided between the specific second select transistor and memory cells is driven with a second voltage having a level higher than the first voltage during a program operation.

14. The memory system of claim 12, wherein the non-volatile memory device and the controller forms a solid state drive SSD.

* * * * *